US008904201B2

(12) United States Patent
Matsubara et al.

(10) Patent No.: US 8,904,201 B2
(45) Date of Patent: Dec. 2, 2014

(54) STORAGE SYSTEM AND ITS CONTROL METHOD

(75) Inventors: Ryosuke Matsubara, Odawara (JP); Hiroki Kanai, Odawara (JP); Shohei Shimahara, Odawara (JP)

(73) Assignee: Hitachi, Ltd., Tokyo (JP)

( * ) Notice: Subject to any disclaimer, the term of this patent is extended or adjusted under 35 U.S.C. 154(b) by 513 days.

(21) Appl. No.: 13/263,253

(22) PCT Filed: Sep. 26, 2011

(86) PCT No.: PCT/JP2011/005394

§ 371 (c)(1),
(2), (4) Date: Oct. 6, 2011

(87) PCT Pub. No.: WO2013/046248

PCT Pub. Date: Apr. 4, 2013

(65) Prior Publication Data

US 2013/0080796 A1 Mar. 28, 2013

(51) Int. Cl.
*G06F 1/00* (2006.01)
*G11B 19/00* (2006.01)
*G06F 1/32* (2006.01)
*G06F 1/20* (2006.01)
*G11B 33/14* (2006.01)
*H05K 7/20* (2006.01)
*G05D 23/00* (2006.01)
*F24F 7/00* (2006.01)

(52) U.S. Cl.
CPC ............ *G11B 19/00* (2013.01); *H05K 7/20836* (2013.01); *G06F 1/3203* (2013.01); *G06F 1/206* (2013.01); *G11B 33/144* (2013.01)
USPC ........... 713/300; 361/299; 361/694; 361/695; 700/299; 236/49.1

(58) Field of Classification Search
USPC .................. 713/300; 361/694, 695; 700/299; 236/49.1
See application file for complete search history.

(56) References Cited

U.S. PATENT DOCUMENTS 5,848,230 A * 12/1998 Walker ......................... 714/6.32
6,932,696 B2 * 8/2005 Schwartz et al. ............ 454/184
7,287,708 B2 * 10/2007 Lucas et al. .................. 236/49.3
7,294,980 B2 * 11/2007 Ma et al. ......................... 318/49
8,078,335 B2 * 12/2011 Matsuda et al. .............. 700/300
8,120,300 B2 * 2/2012 Dishman et al. .............. 318/471

(Continued)

FOREIGN PATENT DOCUMENTS

JP 06-349261 12/1994

*Primary Examiner* — Paul R Myers
*Assistant Examiner* — Christopher A Daley
(74) *Attorney, Agent, or Firm* — Foley & Lardner LLP

(57) ABSTRACT

At the time of a fan failure of a plurality of fans for cooling redundant controllers, data loss can be avoided even if a power source of each controller is controlled.

A storage system includes: a first controller for controlling a first power source; a plurality of first fans for cooling the first controller; a second controller for controlling a second power source; a plurality of second fans for cooling the second controller; and a storage device including a plurality of storage units; wherein if a fan failure of the first fans occurs, the first controller controls the first power source in a standby state on condition that the second controller is in a normal state; and if the second power source is in the standby state, the first controller executes destaging processing and then controls the first power source in the standby state.

12 Claims, 27 Drawing Sheets

340

342 344 346

| bit | FUNCTION | VALUE |
|---|---|---|
| | | 01 : CTL DEACTIVATED STATE |
| bit[1:0] | | 00 : NORMAL |

(56) References Cited

U.S. PATENT DOCUMENTS

| | | | | |
|---|---|---|---|---|
| 8,190,396 | B2 * | 5/2012 | Yanao | 702/183 |
| 8,326,552 | B2 * | 12/2012 | Hillis et al. | 702/58 |
| 8,374,731 | B1 * | 2/2013 | Sullivan | 700/299 |
| 2007/0033431 | A1 * | 2/2007 | Pecone et al. | 714/6 |
| 2009/0164720 | A1 * | 6/2009 | Suzuki et al. | 711/114 |
| 2010/0066172 | A1 * | 3/2010 | Lv et al. | 307/64 |

* cited by examiner

| ADDRESS (302) | FUNCTION (304) |
|---|---|
| 0x00 | ROTATION NUMBER CONTROL MONITOR |
| 0x04 | ROTATION NUMBER MONITOR |
| 0x08 | LOCAL CLUSTER OPERATING STATE |
| 0x0C | ANOTHER CLUSTER OPERATING STATE |
| 0x10 | |
| 0x14 | |
| 0x18 | |
| 0x1C | |
| 0x20 | |
| 0x24 | |
| 0x28 | |
| 0x2C | |

| bit (312) | FUNCTION (314) | SET VALUE (316) |
|---|---|---|
| | | 0000 : 3000rpm |
| bit[11:8] | FAN0 CONTROL | 0001 : 5000rpm |
| bit[7:4] | FAN1 CONTROL | 0010 : 7000rpm |
| bit[3:0] | FAN2 CONTROL | 0011 : 9000rpm |

| bit | FUNCTION | VALUE |
|---|---|---|
| | | 0000 : 3000rpm |
| bit[11:8] | FAN0 NUMBER OF ROTATIONS | 0001 : 5000rpm |
| bit[7:4] | FAN1 NUMBER OF ROTATIONS | 0010 : 7000rpm |
| bit[3:0] | FAN2 NUMBER OF ROTATIONS | 0011 : 9000rpm |

| bit | FUNCTION | VALUE |
|---|---|---|
| | | 01 : CTL DEACTIVATED STATE |
| bit[1:0] | | 00 : NORMAL |

| bit | FUNCTION | VALUE |
|---|---|---|
| | | 01 : CTL DEACTIVATED STATE |
| bit[1:0] | | 00 : NORMAL |

| ADDRESS | FUNCTION |
|---|---|
| 0x00 | CTL TEMPERATURE |
| 0x04 | |
| 0x08 | |
| 0x0C | |

| bit | FUNCTION | SET VALUE |
|---|---|---|
| bit[31:0] | TEMPERATURE AT CTL | INDICATE TEMPERATURE IN HEXADECIMAL NOTATION |

| ADDRESS | FUNCTION |
|---|---|
| 0x00 | CTL POWER CONTROL |
| 0x04 | |
| 0x08 | |
| 0x0C | |

| bit | FUNCTION | VALUE |
|---|---|---|
| | | 11 : STANDBY ON (BACKUP) |
| | | 10 : POWER ON |
| | | 01 : STANDBY ON |
| bit[1:0] | CTL POWER CONTROL | 00 : POWER OFF |

| ADDRESS | FUNCTION |
|---|---|
| 0x00 | ANOTHER CLUSTER OPERATING STATE |
| 0x04 | LOCAL CLUSTER OPERATING STATE |
| 0x08 | |
| 0x0C | |

| bit | FUNCTION | VALUE |
|---|---|---|
| | | 01 : CTL DEACTIVATED STATE |
| bit[1:0] | | 00 : NORMAL |

| bit | FUNCTION | VALUE |
|---|---|---|
| | | 01 : CTL DEACTIVATED STATE |
| bit[1:0] | | 00 : NORMAL |

STORAGE SYSTEM AND ITS CONTROL METHOD

TECHNICAL FIELD

The present invention relates to a storage system, in which a plurality of controllers for controlling data input to and/or output from a plurality of storage units can control a power source according to the status of a plurality of fans for cooling each controller, and to a method for controlling such a storage system.

BACKGROUND ART

There is a type of storage system that is equipped with a plurality of controllers for controlling data input to and/or output from a plurality of storage units. This type of storage system sometimes uses a plurality of fans to cool each controller.

If a redundant configuration using a plurality of fans to cool each controller is employed, even if a failure of one fan occurs, other fans can cool each controller. However, if all the fans or fans, the number of which is equal to or more than a threshold, fail to operate, a failure of each controller itself might be caused by heat generation. Therefore, if all the fans or fans, the number of which is equal to or more than a threshold, fail to operate, a configuration in which the power source of each controller is set to a standby state is employed.

If the power source of each controller is set to the standby state, heat generation of each controller can be reduced by, for example, making a high-heat-generating device(s) from among a plurality of devices constituting each controller enter a reset state or stopping power supply to the high-heat-generating device(s).

It should be noted that in a case of a fan failure, a device for stopping peripheral equipment which may be affected by the fan failure is suggested (see Patent Literature 1).

CITATION LIST

Patent Literature

PTL 1: Japanese Patent Application Laid-Open (Kokai) Publication No. H06-349261

SUMMARY OF INVENTION

Technical Problem

If all the fans or fans, the number of which is equal to or more than a threshold, fail to operate, data retained in each controller, for example, user data, might possibly be deleted by only setting the power source of each controller to the standby state.

Incidentally, Patent Literature 1 discloses that at the time of a fan failure, peripheral equipment which might be affected by the fan failure is stopped; however, it does not disclose a duplex configuration where two sets of the peripheral equipment which might be affected by the fan failure are provided. So, if the duplex configuration is employed for the peripheral equipment for a tape recorder described in Patent Literature 1 is duplexed, the peripheral equipment which might be directly affected by a fan failure can be stopped at the time of the fan failure, but peripheral equipment which will not be directly affected by the fan failure cannot be stopped efficiently.

The present invention was devised in light of the problem of the above-described conventional technology and it is an object of the invention to provide a storage system and its control method capable of avoiding data loss at the time of the occurrence of a failure of a plurality of fans for cooling redundant controllers even if each controller makes transition to a standby state.

Solution to Problem

In order to solve the above-described problem, a storage system according to the present invention includes: a first controller for controlling a first power source in a standby state or a power-on state; a plurality of first fans for cooling the first controller; a second controller for controlling a second power source in the standby state or the power-on state and sending and receiving information to and from the first controller; a plurality of second fans for cooling the second controller; and a storage device including a plurality of storage units; wherein if the first power source is in the standby state, the first controller controls the first fans; and if the first power source is in the power-on state, the first controller controls the first fans and executes data input/output processing on the storage device; wherein if the second power source is in the standby state, the second controller controls the second fans; and if the second power source is in the power-on state, the second controller controls the second fans and executes the data input/output processing on the storage device; and wherein if a fan failure occurs in a fan of the first fans or the second fans for cooling at least one controller of the first controller and the second controller, on condition that the other controller is in a normal state, the one controller controls a power source, which is a control target of the one controller, in the standby state; and if a power source which is a control target of the other controller is in the standby state, the one controller executes destaging processing and then controls the power source, which is the control target of the one controller, in the standby state.

Advantageous Effects of Invention

Upon the occurrence of a failure of a plurality of fans for cooling redundant controllers, data loss can be avoided according to the present invention even if each controller makes transition to a standby state.

BRIEF DESCRIPTION OF DRAWINGS

FIG. 8 is a configuration diagram of an environment monitoring controller register table.

FIG. 9 is a configuration diagram of a rotation number control register table.

FIG. 10 is a configuration diagram of a rotation number monitor table.

FIG. 11 is a configuration diagram of a local cluster management table.

FIG. 12 is a configuration diagram of another cluster management table.

FIG. 13 is a configuration diagram of a thermal monitor register table.

FIG. 14 is a configuration diagram of a thermal monitor management table.

FIG. 15 is a configuration diagram of a power controller register table.

FIG. 16 is a configuration diagram of a power controller management table.

FIG. 17 is a configuration diagram of a CPU register table.

FIG. 18 is a configuration diagram of a CPU register management table for another cluster.

FIG. 19 is a CPU register management table for a local cluster.

DESCRIPTION OF EMBODIMENTS

An embodiment of the present invention will be explained with reference to the attached drawings.

First Embodiment

This embodiment is designed so that if a fan failure occurs, at least one controller of redundant controllers controls its own power source in a standby state on condition that another controller is in a normal state; and if the other controller is in a standby state or a deactivated state, the one controller executes destaging processing and then controls its own power source in the standby state.

Figure 1:
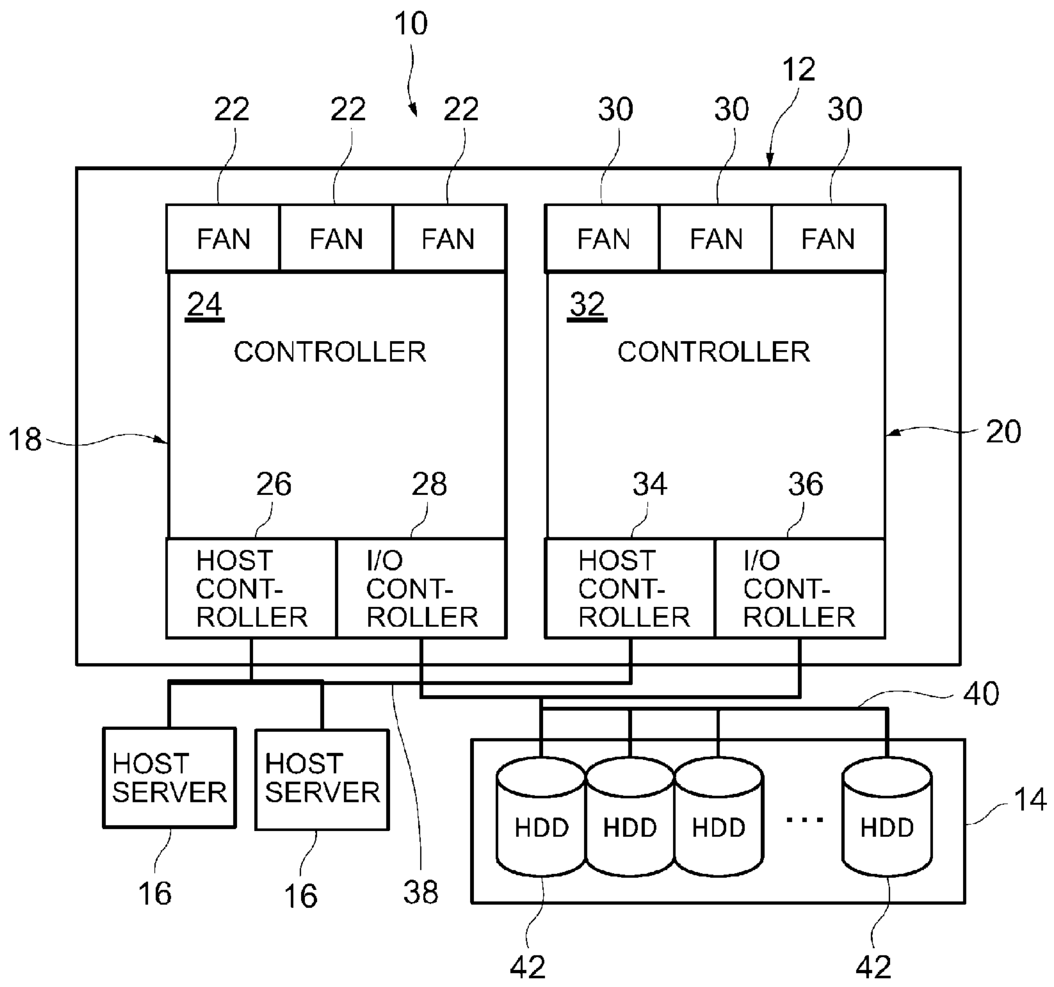
FIG. 1 is an overall configuration diagram of a storage system according to a first embodiment of the present invention.

FIG. 1 is a configuration diagram of a storage system according to an embodiment of the present invention. Referring to FIG. 1, a storage system 10 is constituted from a storage apparatus 12, a storage device 14, and a plurality of host servers 16.

The storage apparatus 12 includes a cluster 18 and a cluster 20 having the same functions as those of the cluster 18 so that the duplex clusters having the same functions are configured.

The cluster 18 is configured as a first cluster equipped with a plurality of fans 22, a controller 24, a host controller 26, and an I/O controller 28. The cluster 20 is configured as a second cluster equipped with a plurality of fans 30, a controller 32, a host controller 34, and an I/O controller 36.

Each host controller 26, 34 is connected via a network 38 to each host server 16. Each I/O controller 28, 36 is connected via a network 40 to the storage device 14.

Examples of the networks 38, 40 can include an FC SAN (Fibre Channel Storage Area Network), an IP SAN (Internet Protocol Storage Area Network), a LAN (Local Area Network), and a WAN (Wide Area Network).

The storage device 14 is composed of a plurality of storage units 42. Examples of the storage units 42 include hard disk drives (HDD), hard disk devices, semiconductor memory devices, optical disk devices, magneto-optical disk devices, magnetic tape devices, and flexible disk devices; and these storage units are data-readable/writable devices.

If the hard disk devices are to be used as the storage units, for example, FC (Fibre Channel) disks, SCSI (Small Computer System Interface) disks, SATA (Serial ATA) disks, ATA (AT Attachment) disks, and SAS (Serial Attached SCSI) disks can be used.

If the semiconductor memory devices are to be used as the storage units, for example, SSD (Solid State Drive), FeRAM (Ferroelectric Random Access Memory), MRAM (Magnetoresistive Random Access Memory), phase change memory (Ovonic Unified Memory), and RRAM (Resistance Random Access Memory) can be used.

Furthermore, each storage unit 42 can constitute a RAID (Redundant Array of Inexpensive Disks) group such as RAID4, RAID5, or RAID6 and each storage unit 42 can be divided into a plurality of RAID groups. Under this circumstance, a plurality of logical units (hereinafter referred to as LU [Logical Units]) or a plurality of logical volumes can be formed in a physical storage area of each storage unit 42.

Each host server 16 is, for example, a computer device equipped with information processing resources such as a CPU (Central Processing Unit), a memory, and an input/output interface and is configured as, for example, a personal computer, a workstation, or a mainframe. Each host server 16 can access logical volumes provided by the storage apparatus 12 by sending an access request designating the logical volumes, for example, a write request or a read request, to the storage apparatus 12.

The plurality of fans 22 are first fans for cooling the controller 24 (controller cooling fans), are composed of three fans, and are located so that they can be freely attached to, or removed from, the cluster 18. Incidentally, the number of the fans 22 is not limited to three and may be two or more.

The controller 24 is one of duplex controllers having the same functions (the other controller is the controller 32) and is configured as a first controller for supervising and controlling the entire cluster 18. The controller 24 executes data input/output processing on the storage device 14 in accordance with, for example, commands from each host server 16 and controls the power source of the cluster 18.

Under this circumstance, a power supply device (not shown) for converting an alternating current into direct current supplies electric power to the cluster 18.

The host controller 26 functions as an interface for relaying data and similar sent and received between the controller 24 and each host server 16, analyzes commands and similar from each host server 16, and transfers the analysis result to the controller 24.

The I/O controller 28 functions as an interface for relaying data and similar sent and received between the controller 24 and the storage device 14 and executes processing for writing data to each storage units 42 or processing for reading data from the storage units 42.

The plurality of fans 30 are second fans for cooling the controller 32 (controller cooling fans), are composed of three fans, and are located so that they can be freely attached to, or removed from, the cluster 20. Incidentally, the number of the fans 30 is not limited to three and may be two or more.

The controller 32 is one of duplex controllers having the same functions (the other controller is the controller 24) and is configured as a second controller for supervising and controlling the entire cluster 20. The controller 32 executes data input/output processing on the storage device 14 in accordance with, for example, commands from each host server 16 and controls the power source of the cluster 20.

Under this circumstance, a power supply device (not shown) for converting an alternating current into direct current supplies power to the cluster 20.

Incidentally, since the cluster 18 and the cluster 20 have the same configuration, only the functions and other elements of the controller 24 may be explained below when explaining processing of the controllers 24, 32, their functions, and so on.

Figure 2:
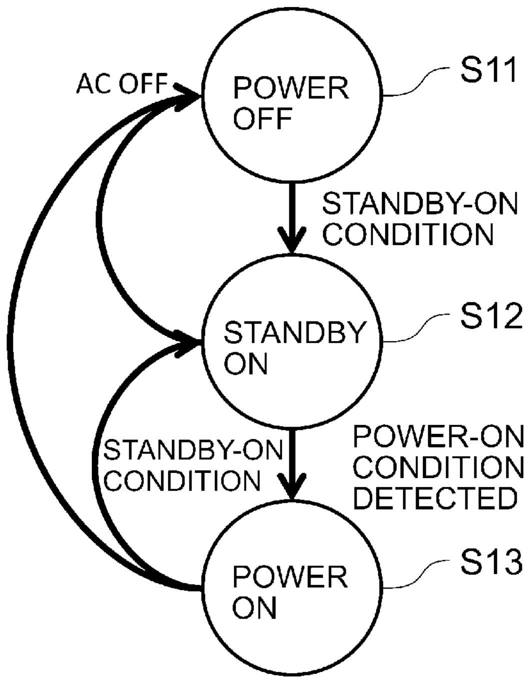
FIG. 2 is a power supply transition diagram showing the status of a power source of the storage apparatus.

Next, FIG. 2 shows a power supply transition diagram showing the status of the power source of the storage apparatus.

When a power switch (not shown) for the power supply device (which is a power supply device composed of a first power source and a second power source) connected to the clusters 18, 20 of the storage apparatus 12 is in an off state and no electric power is supplied from the power supply device to each cluster 18, 20 in FIG. 2, each cluster 18, 20 is in a power-off state (S11).

Next, when the power switch for the power supply device becomes on, the electric power is supplied from the power supply device to the clusters 18, 20, and the standby-on condition is satisfied, the clusters 18, 20 make transition from the power-off state (S11) to a standby-on state (S12). In this case, the electric power is supplied from the power supply device to the fans 22, 30 and also supplied from the power supply device to part of the controllers 24, 32.

Specifically speaking, the fans 22 receive the power supply from the first power source and the fans 30 receive the power supply from the second power source. Furthermore, part of the controller 24 receives the power supply from the first power source and part of the controller 32 receives the power supply from the second power source.

Under this circumstance, if the power source (the first power source) of the cluster 18 and the power source (the second power source) of the cluster 20 make transition from the power-off state (S11) to the standby-on state (S12), the power source (the first power source) of the cluster 18 and the power source (the second power source) of the cluster 20 enter the standby state. In the case where the power source of the cluster 18, makes transition from the power-off state (S11) to the standby-on state (S12), it may sometimes be described as the cluster 18, 20 being in the standby-on state or standby state.

For example, if the power switch for the power supply device becomes off when the clusters 18, 20 are in the standby-on state (S12), the clusters 18, 20 make transition from the standby-on state (S12) to the power-off state (S11); and if a power-on condition is detected, for example, if it is detected that all the fans 22, 30 are in a normal state, the clusters 18, 20 make transition from the standby-on state (S12) to a power-on state (S13).

When the clusters 18, 20 are in the power-on state (S13), the electric power is supplied from the power supply device to each component of the clusters 18, 20.

If the power-on condition is not satisfied and a standby-on condition is detected when the clusters 18, 20 are in the power-on state (S13), for example, if a failure of the fans 22 or the fans 30 occurs, the clusters 18, 20 return from the power-on state (S13) to the standby-on state (S12); and if the power switch becomes off, the clusters 18, 20 return from the power-on state (S13) to the power-off state (S11).

Figure 3:
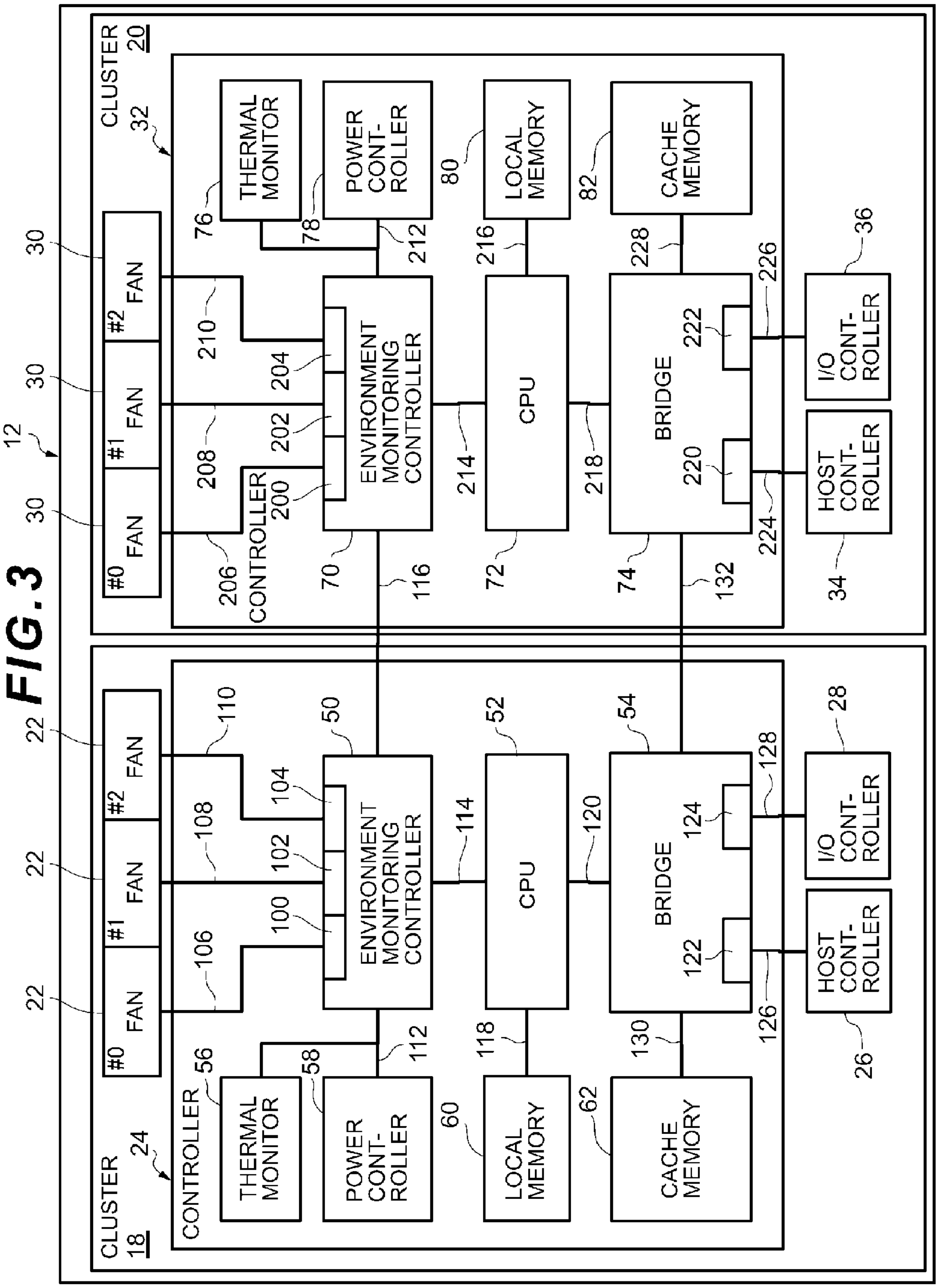
FIG. 3 is an internal configuration diagram of each cluster.

Next, FIG. 3 shows a configuration diagram of each controller.

Referring to FIG. 3, the controller 24 is constituted from an environment monitoring controller 50, a CPU 52, a bridge 54, a thermal monitor 56, a power controller 58, a local memory 60, and a cache memory 62. The controller 32 is constituted from an environment monitoring controller 70, a CPU 72, a bridge 74, a thermal monitor 76, a power controller 78, a local memory 80, and a cache memory 82.

The environment monitoring controller 50 has ports 100, 102, 104; and the port 100 is connected via a path 106 to a fan 22 #0, the port 102 is connected via a path 108 to a fan 22 #1, and the port 104 is connected via a path 110 to a fan 22 #2.

Furthermore, the environment monitoring controller 50 is connected via a path 112 to the thermal monitor 56 and the power controller 58, respectively, via a path 114 to the CPU 52, and via a path 116 to the environment monitoring controller 70.

The environment monitoring controller 50 activates an environment monitoring program, fetches output from the thermal monitor 56, fetches output from each fan 22, controls the number of rotations of each fan 22 based on, for example, a detected temperature of the thermal monitor 56, and executes power supply control of the power controller 58.

The CPU 52 is connected via a path 118 to the local memory 60 and via a path 120 to the bridge 54.

The CPU 52 activates a main microprogram and executes data input/output processing in accordance with commands from the host controller 26.

The bridge 54 has ports 122, 124; and the port 122 is connected via a path 126 to the host controller 26 and the port 124 is connected via a path 128 to the I/O controller 28.

Furthermore, the bridge 54 is connected via a path 130 to the cache memory 62 and via a path 132 to the bridge 74.

The bridge 54 manages the CPU 52, the cache memory 62, the host controller 26, the I/O controller 28, and the bridge 74 as transfer targets and executes data transfer processing on these transfer targets.

The thermal monitor 56 measures an environmental temperature at the controller 24 and outputs the measured result to the environment monitoring controller 50.

The power controller 58 performs power supply control in order to supply the electric power from the power supply device (the first power source) to each component of the cluster 18; and if the standby-on condition is fulfilled, the power controller 58 itself takes in the electric power from the power supply device and enters an operating state and supplies the electric power from the power supply device to each fan 22, the thermal monitor 56, and the environment monitoring controller 50.

Furthermore, if the power-on condition is fulfilled, the power controller 58 itself continues to be in the operating state, continues supplying the electric power to each fan 22, the thermal monitor 56, and the environment monitoring controller 50, and further supplies the electric power from the power supply device to the CPU 52, the bridge 54, the local memory 60, and the cache memory 62.

The local memory 60 constitutes, for example, a working area for the CPU 52 and this local memory 60 stores information of, for example, a main microprogram.

The cache memory 62 is configured as a storage area for temporarily storing data which is requested by an access request from an access requestor (the host server 16) during the process of execution of the data input/output processing by the CPU 52.

The environment monitoring controller 70 has ports 200, 202, 204; and the port 200 is connected via a path 206 to a fan 30 #0, the port 202 is connected via a path 208 to a fan 30 #1, and the port 204 is connected via a path 210 to a fan 30 #2.

Furthermore, the environment monitoring controller 70 is connected via a path 212 to the thermal monitor 76 and the power controller 78, respectively, via a path 214 to the CPU 72, and via a path 216 to the environment monitoring controller 50.

The environment monitoring controller 70 activates an environment monitoring program, fetches output from the thermal monitor 76, fetches output from each fan 30, controls the number of rotations of each fan 30 based on, for example, a detected temperature of the thermal monitor 76, and executes power supply control of the power controller 78.

The CPU 72 is connected via a path 216 to the local memory 80 and via a path 218 to the bridge 74.

The CPU 72 activates the main microprogram and executes data input/output processing in accordance with commands from the host controller 34.

The bridge 74 has ports 220, 222; and the port 220 is connected via a path 224 to the host controller 34 and the port 222 is connected via a path 226 to the I/O controller 36.

Furthermore, the bridge 74 is connected via a path 228 to the cache memory 82 and via a path 132 to the bridge 54.

The bridge 74 manages the CPU 72, the cache memory 82, the host controller 34, the I/O controller 36, and the bridge 54 as transfer targets and executes data transfer processing on these transfer targets.

The thermal monitor 76 measures an environmental temperature at the controller 32 and outputs the measured result to the environment monitoring controller 70.

The power controller 78 performs power supply control in order to supply the electric power from the power supply device (the second power source) to each component of the cluster 20; and if the standby-on condition is fulfilled, the power controller 78 itself takes in the electric power from the power supply device and enters an operating state and supplies the electric power from the power supply device to each fan 30, the thermal monitor 76, and the environment monitoring controller 70.

Furthermore, if the power-on condition is fulfilled, the power controller 78 itself continues to be in the operating state, continues supplying the electric power to each fan 30, the thermal monitor 76, and the environment monitoring controller 70, and further supplies the electric power from the power supply device to the CPU 72, the bridge 74, the local memory 80, and the cache memory 62.

The local memory 80 constitutes, for example, a working area for the CPU 72 and this local memory 80 stores information of, for example, a main microprogram.

The cache memory 82 is configured as a storage area for temporarily storing data which is requested by an access request from an access requestor (the host server 16) during the process of execution of the data input/output processing by the CPU 72.

Figure 4:
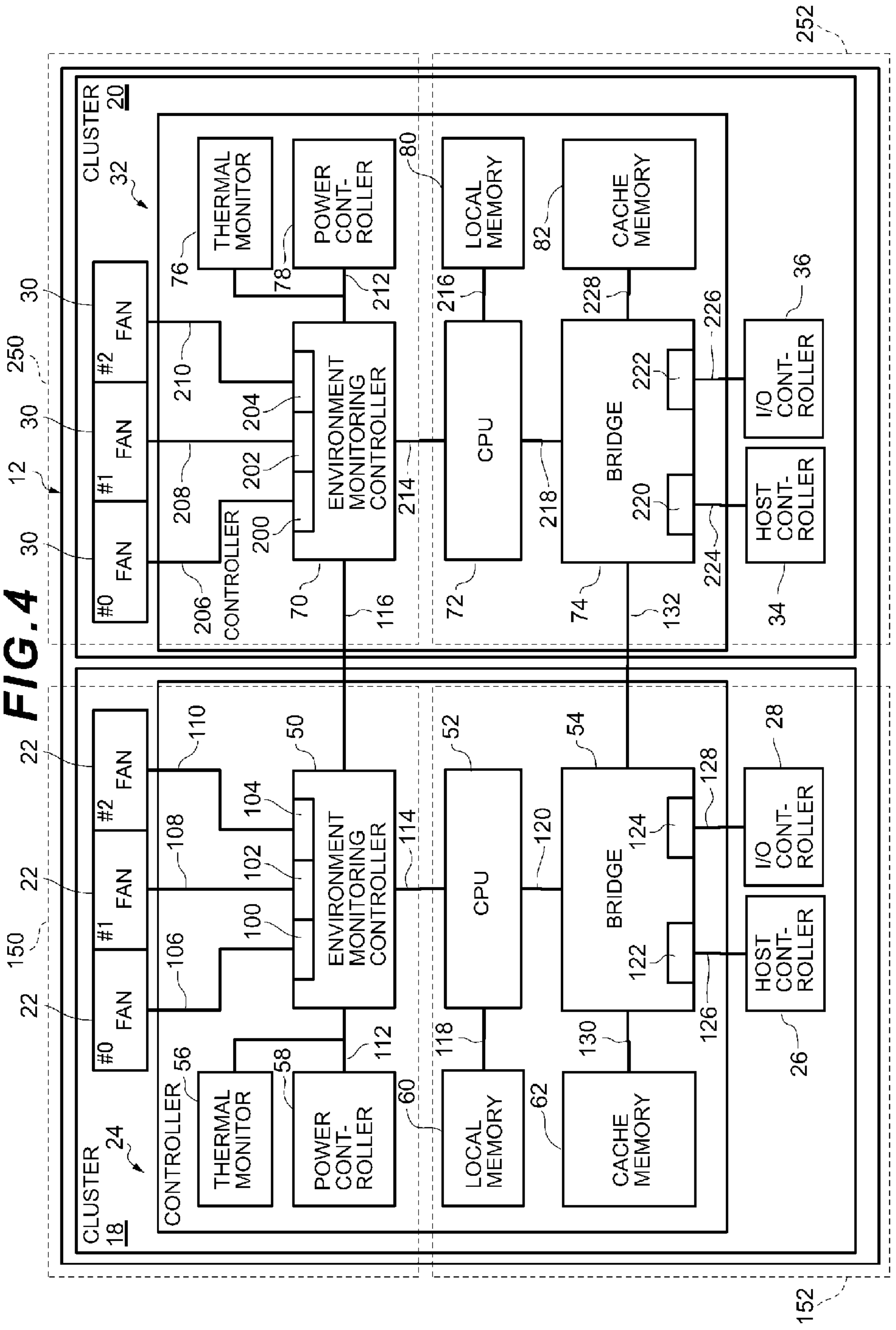
FIG. 4 is a configuration diagram for explaining power supply areas of each cluster.

Next, FIG. 4 shows a configuration diagram for explaining power supply areas of the clusters.

Referring to FIG. 4, a power supply area 150 shows a power supply area of the cluster 18 at the time of standby on and a power supply area 250 shows a power supply area of the cluster 20 at the time of standby on.

Specifically speaking, at the time of standby on, each of the fans 22, 30, the environment monitoring controller 50, 70, the thermal monitor 56, 76, and the power controller 58, 78 enters an operating state in each cluster 18, 20.

The power supply area 150 and a power supply area 152 show power supply areas of the cluster 18 at the time of power on. The power supply area 250 and a power supply area 252 show power supply areas of the cluster 20 at the time of power on.

Specifically speaking, at the time of power on, each component belonging to each cluster 18, 20 enters an operating state in each cluster 18, 20.

Figure 5:
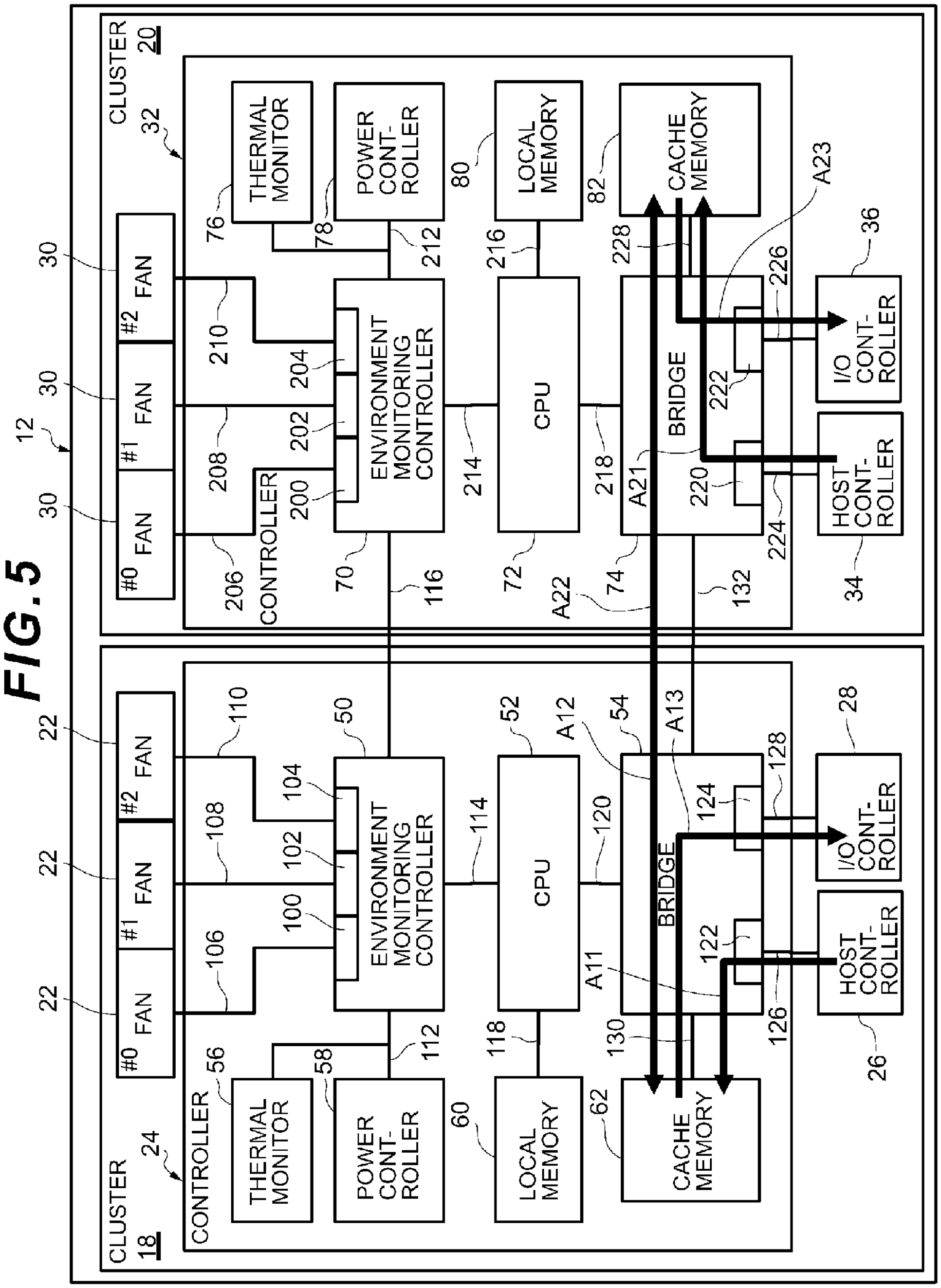
FIG. 5 is a configuration diagram for explaining write processing executed in each cluster.

Next, write processing executed by each controller will be explained with reference to FIG. 5.

If the controller 24 receives a write command or a write request from the host server 16 via the host controller 26, the CPU 52 stores write data, which has been received by the host controller 26, in the cache memory 62 (A11) and executes mirroring processing for storing the write data, which is stored in the cache memory 62, in the cache memory 82 for the controller 32 (A12).

Then, on condition that the write data is stored in the cache memory 62, the CPU 52 sends a report of termination of the write processing via the I/O controller 28 to the host server 16 (A13).

Furthermore, if the controller 32 receives a write command or a write request from the host server 16 via the host controller 34, the CPU 72 stores write data, which has been received by the host controller 34, in the cache memory 82 (A21) and executes mirroring processing for storing the write data, which is stored in the cache memory 82, in the cache memory 62 for the controller 24 (A22).

Then, on condition that the write data is stored in the cache memory 82, the CPU 72 sends a report of termination of the write processing via the I/O controller 36 to the host server 16 (A23).

Figure 6:
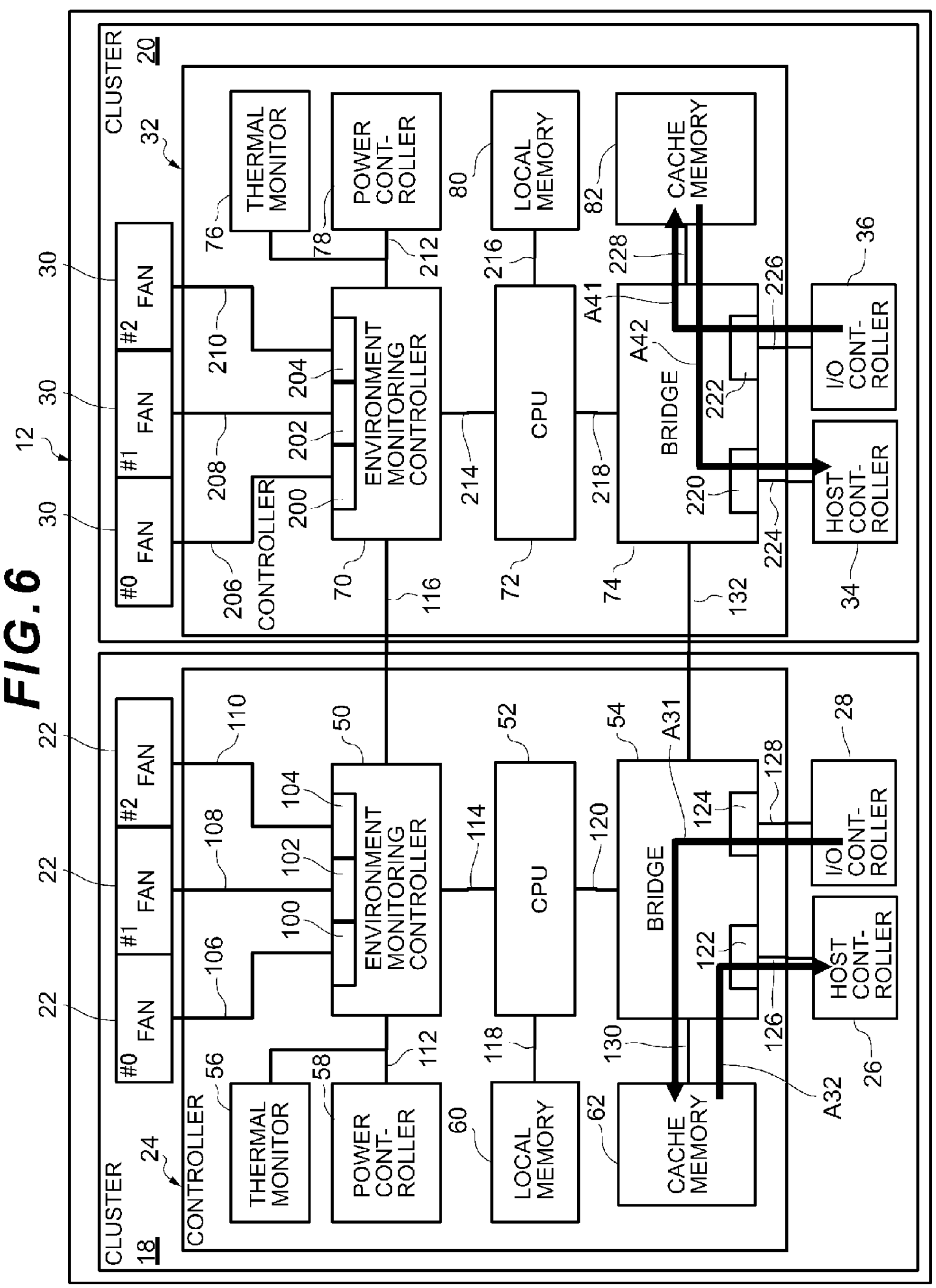
FIG. 6 is a configuration diagram for explaining read processing executed in each cluster.

Next, read processing executed by each controller will be explained with reference to FIG. 6.

If the controller 24 receives a read command or a read request from the host server (the access requestor) 16 via the host controller 26, the CPU 52 judges whether or not read data exists in the cache memory 62, based on the read command received by the host controller 26; and if the read data exists in the cache memory 62 (in a case of a cache hit), the CPU 52 sends the read data via the host controller 26 to the host server 16.

On the other hand, if the read data does not exist in the cache memory 62 (in a case of a cache miss), the CPU 52 reads the read data from the storage units 42 via the I/O controller 28 and writes the read data, which has been read, to the cache memory 62 (A31). Subsequently, the CPU 52 sends the read data, which has been written to the cache memory 62, to the host server 16 via the host controller 26 (A32).

Furthermore, if the controller 32 receives a read command or a read request from the host server 16 via the host controller 34, the CPU 72 judges whether or not read data exists in the cache memory 82, based on the read command received by the host controller 34; and if the read data exists in the cache memory 82 (in a case of a cache hit), the CPU 72 sends the read data via the host controller 34 to the host server 16.

On the other hand, if the read data does not exist in the cache memory 82 (in a case of a cache miss), the CPU 72 reads the read data from the storage units 42 via the I/O controller 36 and writes the read data, which has been read, to the cache memory 82 (A41). Subsequently, the CPU 72 sends the read data, which has been written to the cache memory 82, to the host server 16 via the host controller 34 (A42).

Next, processing of an environment monitoring program and a main microprogram will be explained with reference to FIG. 7.

Figure 7:
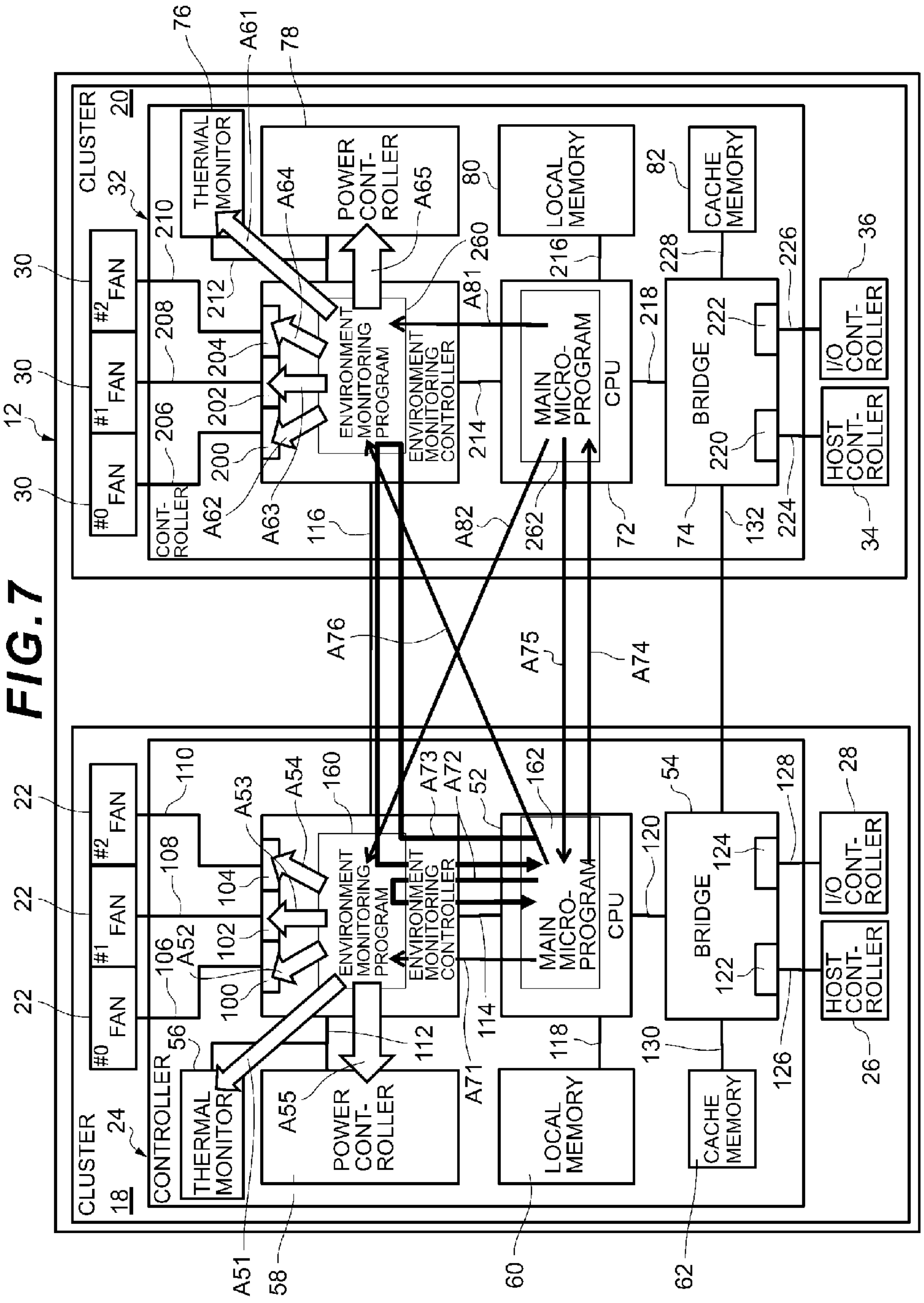
FIG. 7 is a configuration diagram for explaining processing by an environment monitoring program and a main microprogram.

Referring to FIG. 7, each environment monitoring controller 50, 70 is equipped with an environment monitoring program 160, 260 and each CPU 52, 72 is equipped with a main microprogram (hereinafter sometimes referred to as the main micro) 162, 262.

The environment monitoring program 160 decides the number of rotations of each fan 22 based on the temperature obtained from the thermal monitor 56, controls the number of rotations of each fan 22 based on the decided number of rotations, and monitors the presence state of each fan 22 and the number of rotations thereof (A51 to A54).

Furthermore, the environment monitoring program 160 performs power supply control of the power controller 58, executes power supply monitoring to monitor the status of the power supply device (A55), and reports the monitoring result to the main microprogram 162.

The environment monitoring program 260 decides the number of rotations of each fan 30 based on the temperature obtained from the thermal monitor 76, controls the number of rotations of each fan 30 based on the decided number of rotations, and monitors the presence state of each fan 30 and the number of rotations thereof (A61 to A64).

Furthermore, the environment monitoring program 260 performs power supply control of the power controller 78, executes power supply monitoring to monitor the status of the power supply device (A65), and reports the monitoring result to the main microprogram 262.

The main microprogram 162 executes data input/output processing and outputs an environment monitoring information acquisition request to the environment monitoring program 160 (A71). Also, the main microprogram 162 issues a request for transition from power-on to standby-on to the environment monitoring program 160 (A72) and issues a request to the environment monitoring program 160 to obtain environment monitoring information on the controller 32 side (A73).

Furthermore, the main microprogram 162 executes processing for sharing the operating state of the clusters 18, 20 with the main microprogram 262 (A74, A75). Also, on condition that the destaging processing has been completed, the main microprogram to 162 issues a standby-on transition request to the environment monitoring program 160 and the environment monitoring program 260 (A71, A76).

The main microprogram 262 executes the same processing as that of the main microprogram 162 and, for example, executes the processing for sharing the operating state of the clusters 18, 20 with the main microprogram 162 (A74, A75). Also, on condition that the destaging processing has been completed, the main microprogram to 262 issues a standby-on transition request to the environment monitoring program 160 and the environment monitoring program 260 (A81, A82).

Next, FIG. 8 shows a configuration diagram of an environment monitoring register table.

Referring to FIG. 8, the environment monitoring register table 300 is a table for managing a plurality of registers mounted in each environment monitoring controller 50, 70 and is constituted from an address 302 and a function 304. The address 302 is an identifier for identifying each register. The function 304 is information for identifying a function of each register.

The address 302 stores, for example, "0x00," "0x04," "0x08," "0x0C," and so on.

The function 304 stores, for example, "Rotation Number Control Register" corresponding to the address "0x00" as information for identifying the function of the register for controlling the number of rotations of the fans 22, 30.

Also, the function 304 stores "Rotation Number Monitor" corresponding to the address "0x04" as information for identifying the function of the register for monitoring the number of rotations of the fans 22, 30.

Moreover, the function 304 corresponding to the address "0x08" stores "Local Cluster Operating State" as information for identifying the function of the register for managing the operating state of the cluster itself.

Furthermore, the function 304 corresponding to the address "0x0C" stores "Another Cluster Operating State" as information for identifying the function of the register for managing the operating state of another cluster.

Next, FIG. 9 shows a configuration diagram of a rotation number control register table.

Referring to FIG. 9, a rotation number control register table 310 is a table for managing a rotation number control register and is constituted from a bit 312, a function 314, and a set value 316. The bit 312 stores, for example, information about a bit for controlling the fans 22. The function 314 stores information for identifying each fan 22. The set value 316 stores a set value about the number of rotations identified by the bit 312.

Next, FIG. 10 shows a configuration diagram of a rotation number monitor table.

Referring to FIG. 10, a rotation number monitor table 320 is a table for managing the number of rotations of each fan 22, 30 and is constituted from a bit 322, a function 324, and a value 326.

The bit 322 is information for identifying the number of rotations of each fan 22, 30.

The function 324 is information for identifying each fan 22, 30. The value 326 stores a value about the number of rotations identified by the bit 322.

Next, FIG. 11 shows a configuration diagram of a local cluster management table.

Referring to FIG. 11, a local cluster management table 330 is a table used by each cluster 18, 20 to manage its own operating state and is constituted from a bit 332, a function 334, and a value 336.

The bit 332 stores, for example, a bit for managing the operating state of the cluster 18. The function 334 does not store specific information in this table. The value 336 stores information about the operating state of the cluster 18 identified by the bit 332.

For example, if the bit is "01," the value 336 stores "CTL Deactivated State" as information indicating that the controller 24 for the cluster 18 is in a deactivated state (for example, a state in which the rotation number control of the fans 22 is stopped). If the bit is "00," the value 336 stores "Normal" as information indicating that the controller 24 for the cluster 18 is normal.

Next, FIG. 12 shows a configuration diagram of another cluster management table.

Referring to FIG. 12, another cluster management table 340 is a table used by the cluster 18, 20 to manage the operating state of the other cluster and is constituted from a bit 342, a function 344, and a value 346.

For example, if the cluster 18 manages the operating state of the cluster 20, the bit 342 stores a bit for managing the operating state of the cluster 20. The function 344 does not store specific information in this table. The value 346 stores information about the operating state of the cluster identified by the bit 342, for example, the cluster 20.

For example, if the bit is "01," the value 346 stores "CTL Deactivated State" as information indicating that the controller 32 for the cluster 20 is in a deactivated state. If the bit is "00," the value 346 stores "Normal" as information indicating that the controller 32 for the cluster 20 is normal.

Next, FIG. 13 shows a configuration diagram of a thermal monitor register table.

Referring to FIG. 13, a thermal monitor register table 350 is a table for managing a thermal monitor register and is constituted from an address 352 and a function 354.

The address 352 stores, for example, "0x00" as the address for identifying the register for the thermal monitor 56. The function 354 stores information for identifying the function of the register for the thermal monitor 56, 76. For example, if the register for the thermal monitor 56 monitors a temperature of the controller 24, the function 354 stores "CTL Temperature" corresponding to the address "0x00."

Next, FIG. 14 shows a configuration diagram of a controller temperature management table.

The controller temperature management table 360 is a table for managing a temperature of the controllers 24, 32 and is constituted from a bit 362, a function 364, and a set value 366.

The bit 362 stores information indicating, for example, a temperature at the controller 24. For example, if the thermal monitor 56 monitors the temperature of the controller 24, the function 364 stores "Temperature at CTL." The set value 366 stores a set value of the temperature at the controllers 24, 32 in hexadecimal notation.

Next, FIG. 15 shows a configuration diagram of a power controller register table.

Referring to FIG. 15, a power controller register table 370 is a table for managing the power controllers 58, 78 and is constituted from an address 372 and a function 374.

The address 372 stores, for example, "0x00" as the address for identifying the power controller 58. The function 374 stores information about the function of the power controllers 58, 78. For example, if the power controller 58 performs the power supply control of the controller 24, the function 374 stores "CTL Power Control."

Next, FIG. 16 shows a configuration diagram of a power controller management table.

Referring to FIG. 16, a power controller management table 380 is a table for managing each power controller 58, 78 and is constituted from a bit 382, a function 384, and a value 386.

The bit 382 stores a bit indicating the operating state of each power controller 58, 78. If each power controller 58, 78 performs the power supply control of the controller 24 or the controller 32, the function 384 stores "CTL Power Control" as information about the function of each power controller 58, 78.

The value 386 stores information indicating information identified by the bit 382, which is information indicating the operating state of each power controller 58, 78.

For example, if the bit is "11," the value 386 stores "Standby On (Backup)"; and if the bit is "10," the value 386 stores "Power On." Furthermore, if the bit is "01," the value 386 stores "Standby On"; and if the bit is "00," the value 386 stores "Power Off."

Next, FIG. 17 shows a configuration diagram of a CPU register table.

Referring to FIG. 17, the CPU register table 390 is a table for managing the operating state of the clusters 18, 20 and is constituted from an address 392 and a function 394.

The address 392 stores, for example, "0x00" or "0x04" as the address for identifying the CPU register for managing the operating state of the clusters 18, 20.

The function 394 stores information about the operating state of the cluster to be managed. For example, when the CPU register used for the cluster 18 manages the operating state of the cluster 20, the function 394 corresponding to the address "0x00" stores "Another Cluster Operating State." Furthermore, when the CPU register used for the cluster 18 manages the operating state of the cluster 18, the function 394 corresponding to the address "0x04" stores "Local Cluster Operating State."

Next, FIG. 18 shows a configuration diagram of a CPU register management table.

Referring to FIG. 18, a CPU register management table 400 is a table used by the cluster 18, 20 to manage the operating state of the other cluster and is constituted from a bit 402, a function 404, and a value 406.

For example, if the CPU register for the cluster 18 manages the operating state of the cluster 20, the bit 402 stores a bit for managing the operating state of the cluster 20. The function 404 does not store specific information in this table. If the cluster identified by the bit 402, for example, the CPU register for the cluster 18 manages the operating state of the cluster 20, the value 406 stores information about the operating state of the cluster 20.

For example, if the bit is "01," the value 406 stores "CTL Deactivated State" as information indicating that the controller 32 for the cluster 20 is in a deactivated state; and if the bit is "00," the value 406 stores "Normal" as information indicating that the controller 32 for the cluster 20 is normal.

FIG. 19 shows a configuration diagram of a CPU register management table.

Referring to FIG. 19, a CPU register management table 410 is a table used by the cluster 18, 20 to manage its own operating state and is constituted from a bit 412, a function 414, and a value 416.

For example, if the CPU register for the cluster 18 manages the operating state of the cluster 18, the bit 412 stores a bit for managing the operating state of the cluster 18. The function 414 does not store specific information in this table. If the cluster identified by the bit 412, for example, the CPU register for the cluster 18 manages the operating state of the cluster 18, the value 416 stores information about the operating state of the cluster 18.

For example, if the bit is "01," the value 416 stores "CTL Deactivated State" as information indicating that the controller 24 for the cluster 18 is in a deactivated state. if the bit is "00," the value 416 stores "Normal" as information indicating that the controller 24 for the cluster 18 is normal.

Figure 20:
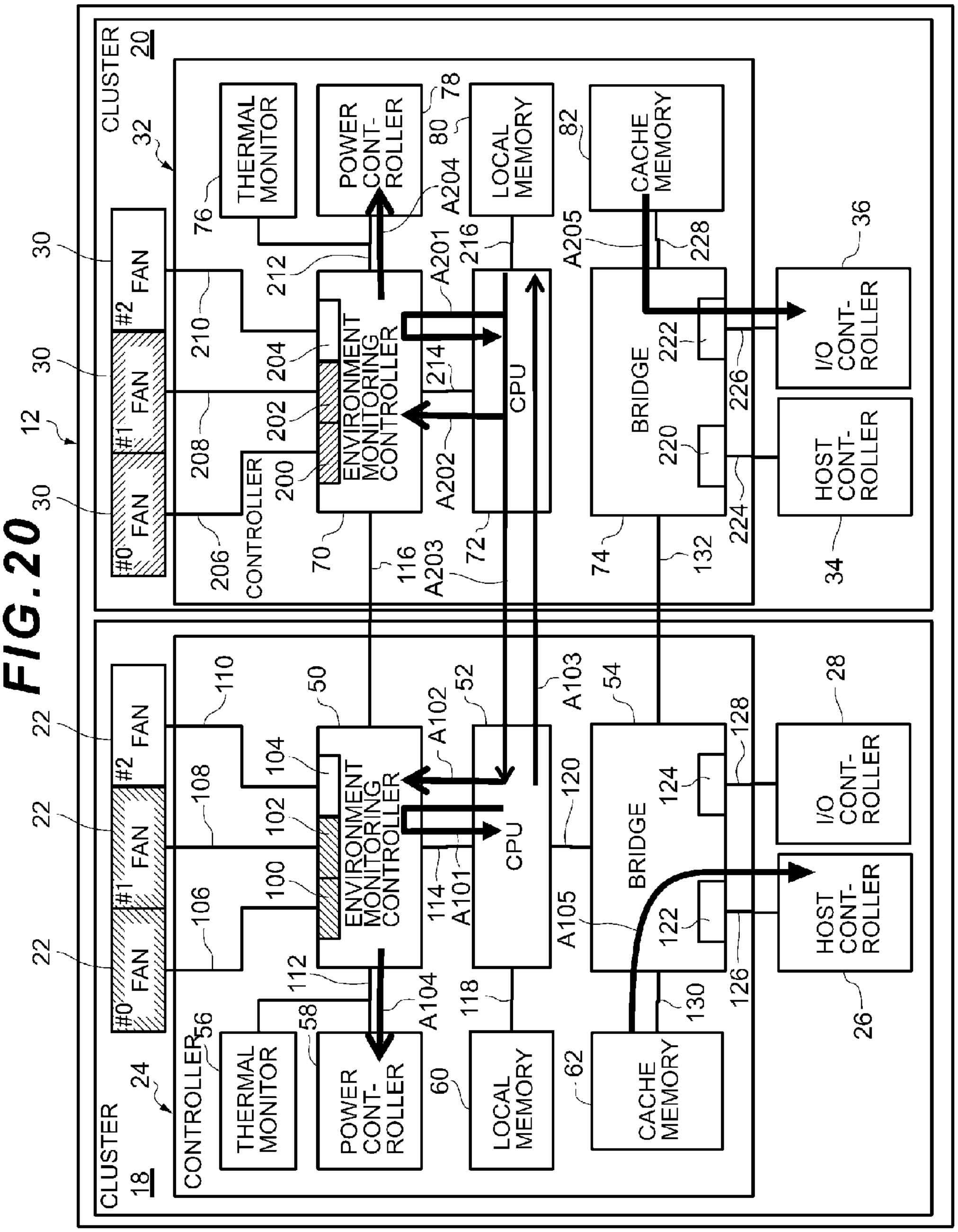
FIG. 20 is a configuration diagram for explaining a state of a fan failure.

Next, FIG. 20 shows a configuration diagram of the cluster at the time of a fan failure.

If the cluster 18 includes three fans 22 and the cluster 20 includes three fans 30 as shown in FIG. 20, if fans, the number of which is equal to or more than a threshold, among the three fans 22, 30, for example, two or more fans 22, 30 fail to operate, the environment monitoring program 160, 260 in the environment monitoring controller 50, 70 or the main microprogram 162, 262 in the CPU 52, 72 executes processing at the time of the fan failure (A101 to A105, A201 to A205).

When this happens, if each environment monitoring program 160, 260 detects an insufficient number of rotations, that is, the number of rotations of the fans 22 or the fans 30 is less than the set value, or detects an excessive number of rotations, that is, the number of rotations of the fans 22 or the fans 30 is more than the set value, it determines that the fans 22 or the fans 30 fail to operate (fan failure); and reports the occurrence of the fan failure to the main microprogram 162, 262.

Figure 21:
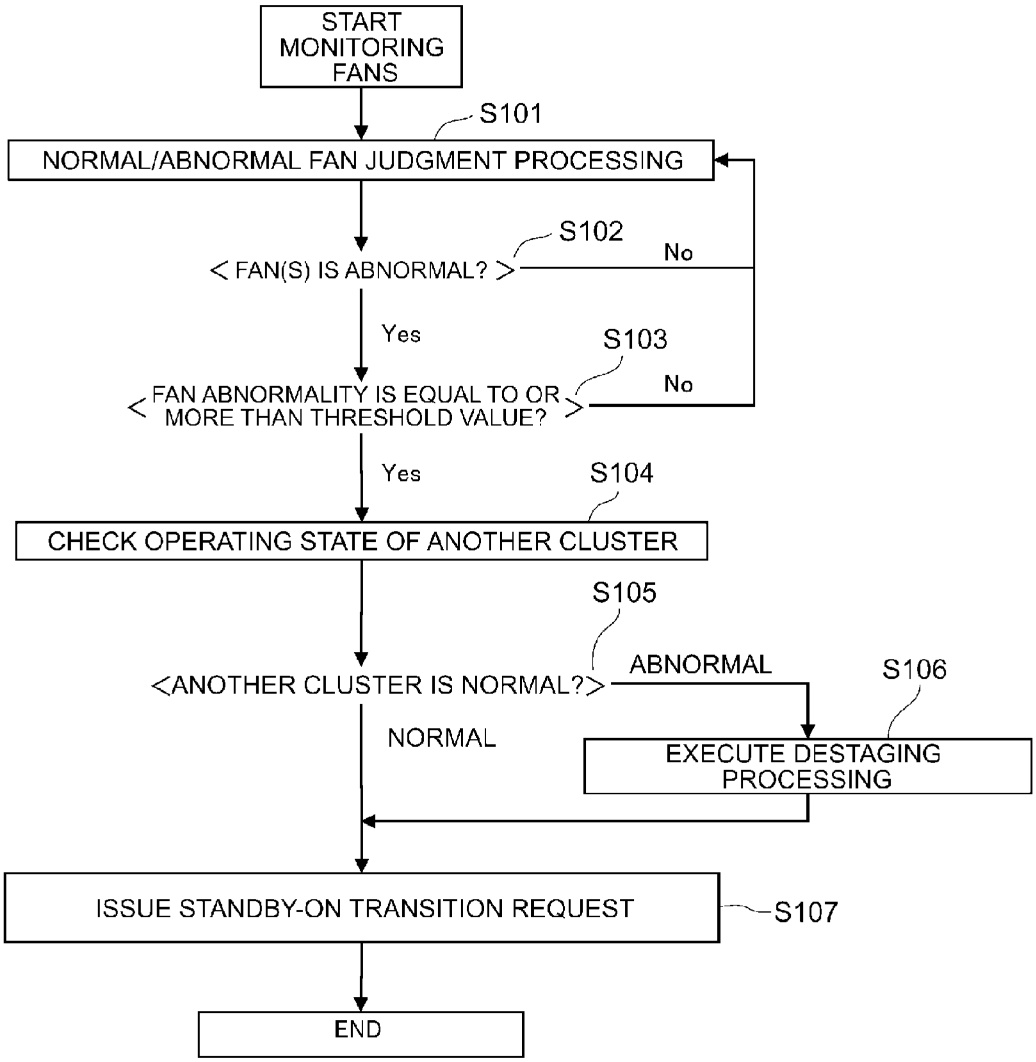
FIG. 21 is a flowchart for explaining actions at the time of a fan failure in one cluster.

Specific processing executed at the time of the fan failure will be explained with reference to a flowchart in FIG. 21. It should be noted that the processing at the time of the fan failure can be executed by having the main microprogram 162 function as a master and the main microprogram 262 function as a slave. Alternatively, the processing at the time of the fan failure can be executed by the main microprogram 162 and the main microprogram 262 respectively without establishing a master-slave relationship between the main microprogram 162 and the main microprogram 262.

Firstly, after starting fan monitoring processing, the main microprogram 162 executes processing for judging, based on the monitoring result from the environment monitoring program 160, whether the fans 22 are normal or abnormal (S101).

The main microprogram 162 executes processing for judging, based on the monitoring result from the environment monitoring program 160, whether the fans 22 are abnormal or not (S102); and if no abnormality is found in each fan 22, the main microprogram 162 returns to the processing in step S101; if it is determined that any of the fans 22 is abnormal, the main microprogram 162 judges whether the fan abnormality is equal to or more than a threshold (S103).

If the main microprogram 162 determines in step S103 that the fan abnormality is not equal to or more than the threshold, that is, if it determines that one of the three fans 22 is abnormal, it returns to the processing in step S101.

On the other hand, if the main microprogram 162 determines in step S103 that the fan abnormality is equal to or more than the threshold, that is, if it determines that the two or more fans 22 are abnormal, the main microprogram 162 executes processing for checking the operating state of the cluster 20 which is the other cluster (S104).

When this happens, the main microprogram 162 refers to the CPU register management table 400 and judges whether the other cluster, that is, the cluster 20 is normal or not (S105).

If the main microprogram 162 determines in step S105 that the cluster 20 is abnormal, it executes destaging processing because the cluster 20 is in the deactivated state or the standby state (S106).

Specifically speaking, the main microprogram 162 executes the destaging processing for storing data, which is stored in the cache memory 62, in the storage units 42 via the I/O controller 28 before the cluster 18 makes transition to the standby-on state.

On the other hand, if the main microprogram 162 determines in step S105 that the cluster 20 is normal, or if it executes the destaging processing in step S106, it notifies the environment monitoring program 160 of a request for having the cluster 18 make transition to the standby-on state (S107), then sets the operating state of the cluster 18 to the deactivated state, registers this setting result to the CPU register management table 410, and terminates the processing in this routine.

Incidentally, if the cluster 20 is in the normal state, the main microprogram 262 for the cluster 20 starts monitoring processing on the environment monitoring program 260 as triggered by the cluster 18 entering the deactivated state.

Furthermore, the environment monitoring program 160 which has received the request from the main microprogram 162 for having the cluster 18 make transition to the standby-on state issues standby-on setting instruction to the power controller 58. Once the power controller 58 sets the power supply device to the standby-on state, the cluster 18 makes transition from the power-on state to the standby-on state (the standby state). Then, the environment monitoring program 160 executes processing for monitoring recovery of the failed fans 22 to the normal state.

Figure 22:
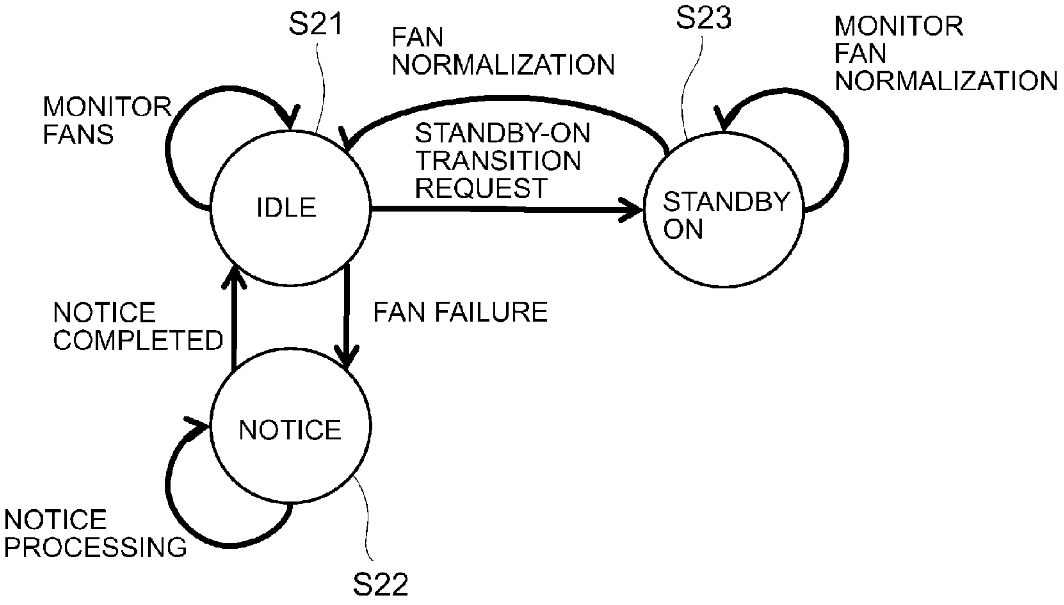
FIG. 22 is a state transition diagram for explaining the status of fans.

Next, FIG. 22 shows a state transition diagram of the environment monitoring program for monitoring the status of the fans.

When the environment monitoring program 160 monitors the status of each fan 22 in FIG. 22, it is in an idle state (S21). If a failure of the two or more fans 22 occurs and the fan failure is detected when the environment monitoring program 160 is in the idle state (S21), the environment monitoring program 160 makes transition to a notice state of issuing notice of the fan failure to the main microprogram 162 (S22); and when the fan failure notice is completed, the environment monitoring program 160 returns to the idle state (S21) and continues monitoring each fan 22.

Next, if the environment monitoring program 160 receives a standby-on transition request from the main microprogram 162 when it is in the idle state (S21), it makes transition from the idle state (S21) to the standby-on state (S23) and monitors normalization of the failed fans 22. Then, if the failed fans 22 have recovered to the normal state and all the fans 22 are normalized, the environment monitoring program 160 returns from the standby-on state (S23) to the idle state (S21).

Figure 23:
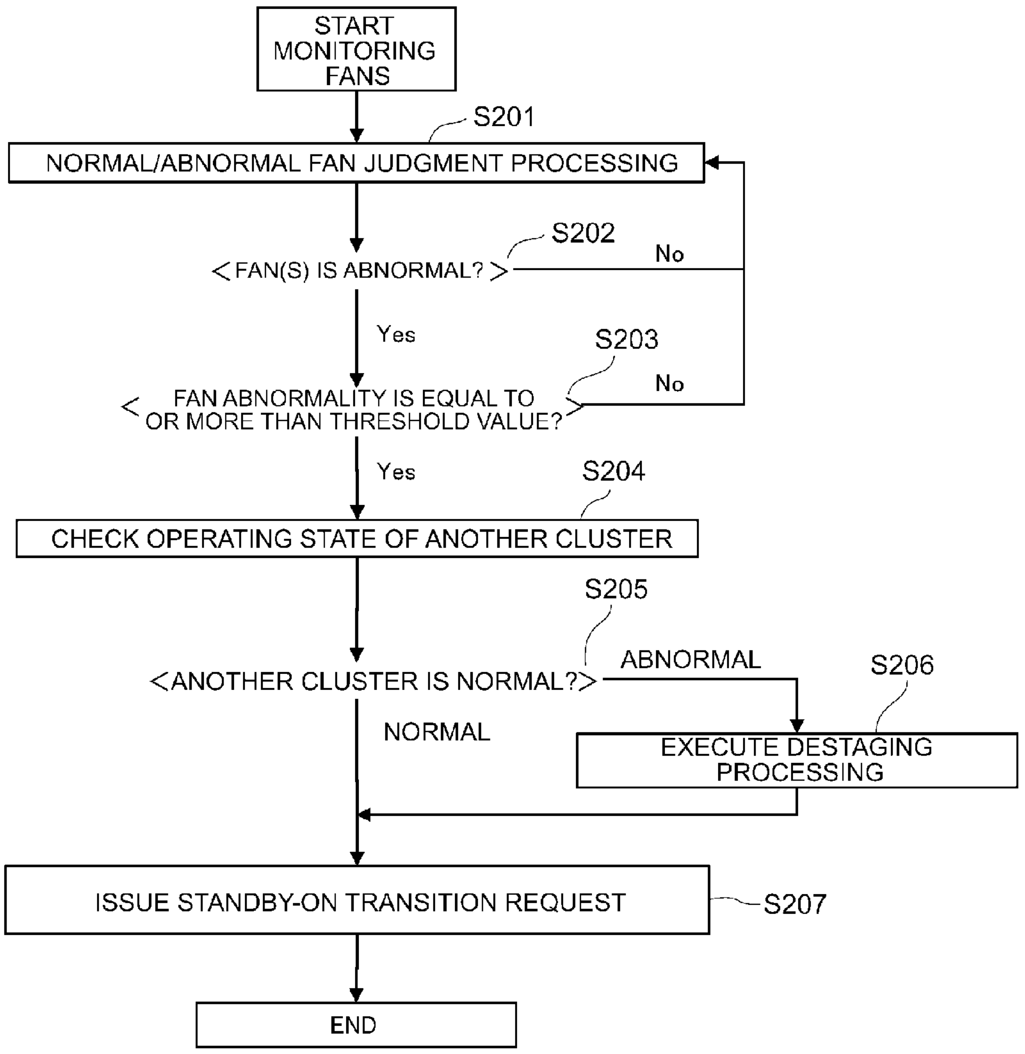
FIG. 23 is a flowchart for explaining processing at the time of a fan failure in both clusters.

Next, processing to be executed when a failure of the fans 22 for the cluster 18 occurs and then a failure of the fans 30 for the cluster 20 occurs will be explained with reference to a flowchart in FIG. 23.

Firstly, if the environment monitoring program 260 of the cluster 20 detects a failure of the fans 22 as well as a failure of the fans 30, the main microprogram 262 which has received the monitoring result from the environment monitoring program 260 starts processing for judging whether the fans 30 are normal or abnormal (S201).

Subsequently, the main microprogram 262 judges whether the fans 30 are abnormal or not (S202). If all the fans 30 are not abnormal, the main microprogram 262 returns to the processing in step S201; and if the main microprogram 262 determines that the fans 30 are abnormal, it judges whether the fan abnormality is equal to or more than a threshold (S203).

If the main microprogram 262 determines in step S203 that the fan abnormality is not equal to or more than the threshold, that is, if the two or more fans 30 are not abnormal, the main microprogram 262 returns to the processing in step S201.

On the other hand, if the main microprogram 262 determines in step S203 that the two or more fans 30 are abnormal, it executes processing for checking the operating state of the cluster 18 which is the other cluster (S204).

Next, the main microprogram 262 judges whether the cluster 18, which is the other cluster, is normal or not (S205). In this case, since the cluster 18 is already in the deactivated state due to the failure of the fans 22, the main microprogram 262 determines that the other cluster is abnormal.

If two or more fans 30 further become abnormal after the occurrence of abnormality in the two or more fans 22 and the fan failure thereby occurs in the cluster 20, it would be difficult to continue the operation of the cluster 20 any further.

Therefore, the main microprogram 262 executes the destaging processing before the cluster 20 make transition to the standby-on state (S206).

When this happens, the main microprogram 262 executes the destaging processing for storing data, which is stored in the cache memory 82, in the storage units 42 via the I/O controller 36. As a result, it is possible to prevent loss of the data stored in the cache memory 82.

Then, if the cluster 18 is normal, or on condition that the destaging processing has been completed, the main microprogram 262 issues a standby-on transition request to the environment monitoring program 260 (S207), and terminates the processing in this routine.

Subsequently, the environment monitoring program 260 in the standby-on state monitors recovery of the failed fans 30 to the normal state.

Next, another processing method executed by the main microprogram 162 when the fans for the cluster 18 fail to operate will be explained with reference to a flowchart in FIG. 24.

Firstly, after starting the fan monitoring processing, the main microprogram 162 executes processing for judging, based on the monitoring result from the environment monitoring program 160, whether the fans 22 are normal or abnormal (S301).

The main microprogram 162 judges, based on the monitoring result from the environment monitoring program 160, whether the fans 22 are abnormal or not (S302); and if no abnormality is found in each fan 22, the main microprogram 162 returns to the processing in step S301; if it is determined that any of the fans 22 is abnormal, the main microprogram 162 judges whether the fan abnormality is equal to or more than a threshold (S303).

If the main microprogram 162 determines in step S303 that the fan abnormality is not equal to or more than the threshold, that is, if it determines that one of the three fans 22 is abnormal, it returns to the processing in step S301.

On the other hand, if the main microprogram 162 determines in step S303 that the fan abnormality is equal to or more than the threshold, that is, if it determines that two or more fans 22 are abnormal, the main microprogram 162 executes processing for checking the operating state of the cluster 20 which is the other cluster (S304).

When this happens, the main microprogram 162 refers to the CPU register management table 400 and judges whether the other cluster, that is, the cluster 20 is normal or not (S305).

If the main microprogram 162 determines in step S305 that the cluster 20 is abnormal, it executes the destaging processing because the cluster 20 is in the deactivated state or the standby state (S306).

Specifically speaking, the main microprogram 162 executes the destaging processing for storing data, which is stored in the cache memory 62, in the storage units 42 via the I/O controller 28 before the cluster 18 makes transition to the standby-on state.

Subsequently, the main microprogram 162 notifies the environment monitoring program 160 of a request for having the cluster 18 make transition to the standby-on state (S307).

On the other hand, if the main microprogram 162 determines in step S305 that the cluster 20 which is the other cluster is normal, or if it executes the processing in step S307, the main microprogram 162 sets the operating state of the cluster 18 to the deactivated state, registers this setting result to the CPU register management table 410, and terminates the processing in this routine.

Incidentally, if the cluster 20 in the normal state, the main microprogram 262 for the cluster 20 starts monitoring processing on the environment monitoring program 260 as triggered by the cluster 18 entering the deactivated state.

Furthermore, the environment monitoring program 160 which has received the request from the main microprogram 162 for having the cluster 18 make transition to the standby-on state issues standby-on setting instruction to the power controller 58. Once the power controller 58 sets the power supply device to the standby-on state, the cluster 18 makes transition from the power-on state to the standby-on state (the standby state). Then, the environment monitoring program 160 executes processing for monitoring recovery of the failed fans 22 to the normal state.

Figure 25:
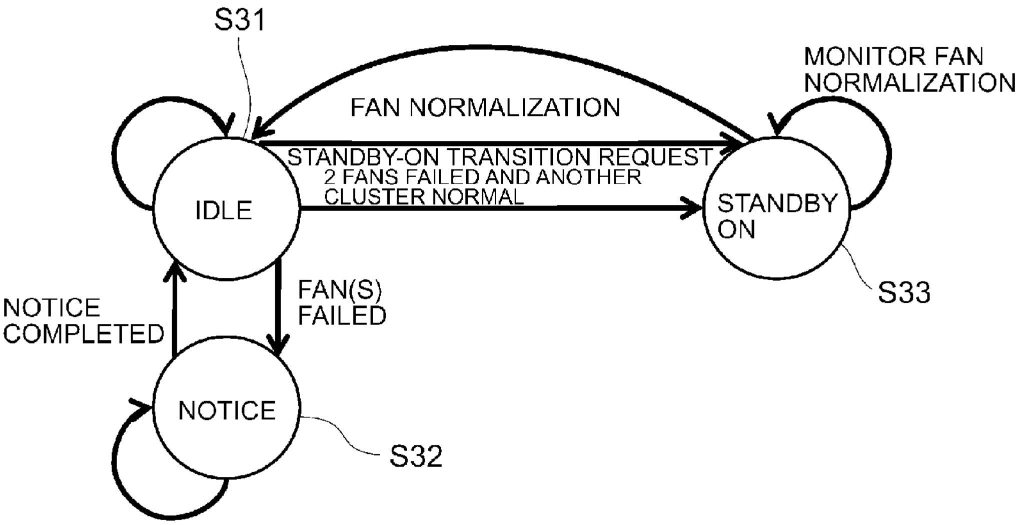
FIG. 25 is a state transition diagram for explaining the status of an environment monitoring program.

Next, FIG. 25 shows another state transition diagram of the environment monitoring program.

Figure 24:
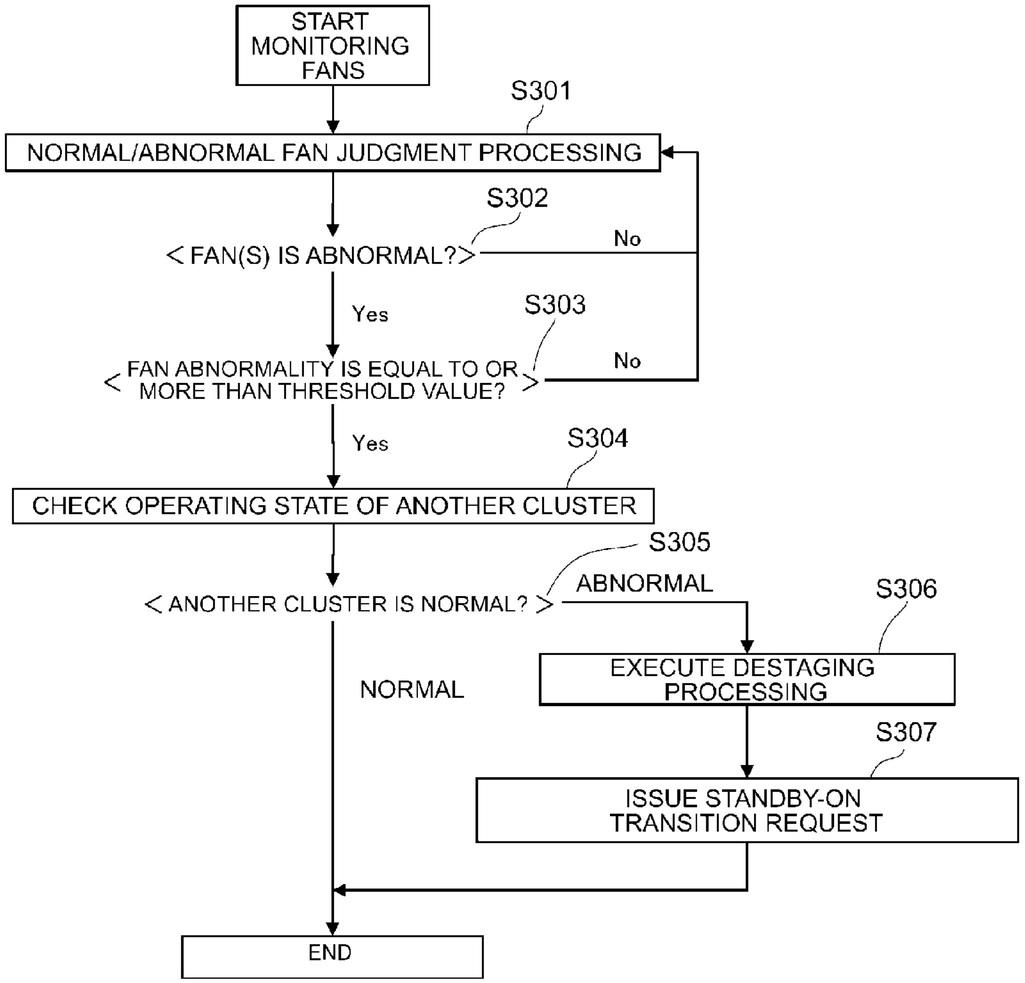
FIG. 24 is a flowchart for explaining another processing method executed at the time of a fan failure in one cluster.

If the main microprogram 162 executes the processing in FIG. 24 as shown in FIG. 25, the environment monitoring program 160 is in the idle sate (S31) when it monitors the status of each fan 22. Incidentally, since the environment monitoring program 160 and the environment monitoring program 260 make transition in the same sate, only the status of the environment monitoring program 160 will be explained below.

If a failure of two or more fans 22 occurs and the fan failure is thereby detected when the environment monitoring program 160 is in the idle state (S31), the environment monitoring program 160 makes transition to a notice state (S32) of issuing notice of the fan failure to the main microprogram 162; and when the fan failure notice is completed, the environment monitoring program 160 returns from the notice state (S32) to the idle state (S31) and continues monitoring each fan 22.

Next, when the environment monitoring program 160 is in the idle state (S31) and if a failure of the two or more fans 22 occurs and the cluster 20, which is the other cluster, is normal or the environment monitoring program 160 receives a standby-on transition request from the main microprogram 162, the environment monitoring program 160 makes transition from the idle state (S31) to the standby-on state (S33) and monitors normalization of the failed fans 22. Then, if the failed fans 22 have recovered to the normal state and all the fans 22 are normalized, the environment monitoring program 160 returns from the standby-on state (S33) to the idle state (S31).

Figure 26:
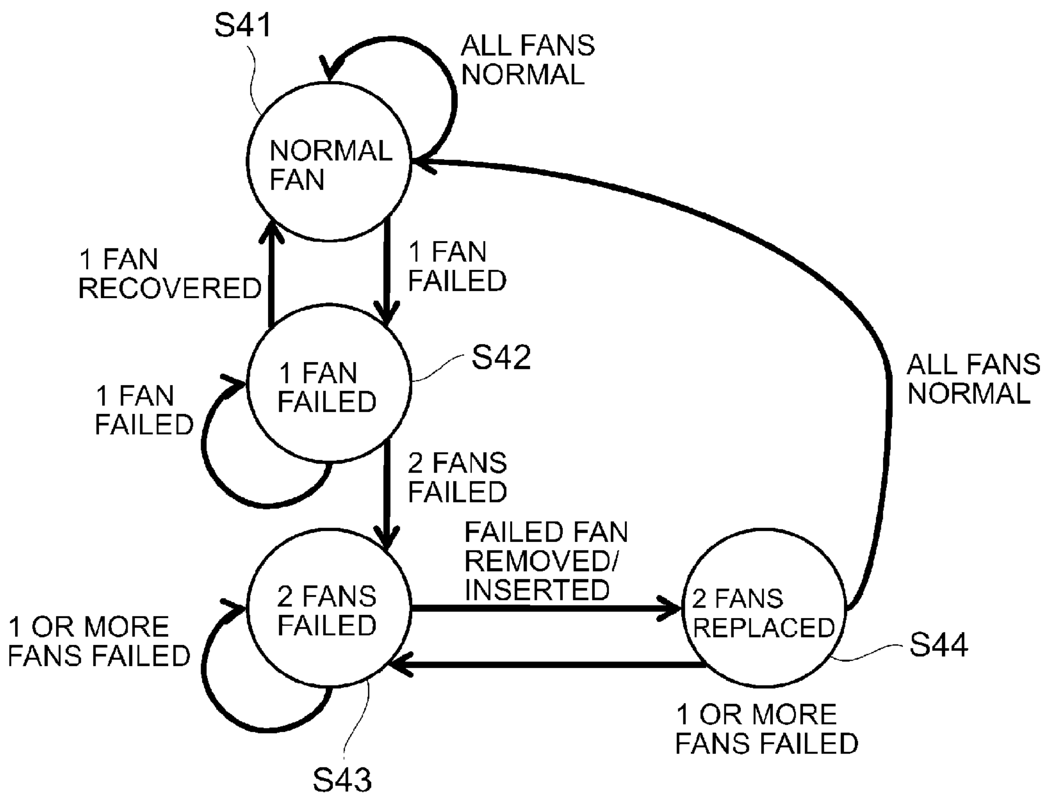
FIG. 26 is a state transition diagram for explaining the status of the fans.

Next, FIG. 26 shows a state transition diagram of the fans.

For example, if all the three fans 22 for the cluster 18 are normal with respect to the fans 22 for the cluster 18 or the fans 30 for the cluster 20 as shown in FIG. 26, the fans 22 are in a normal fan state (S41). Incidentally, since the fans 22 and the fans 30 make transition in the same state, only the status of the fans 22 will be explained below.

If one of the three fans 22 fails to operate, the fans 22 make transition from the normal fan state (S41) to a one-fan-failed state (S42). Whether the fans 22 are in the one-fan-failed state or not is monitored under this circumstance. If the failed one fan has recovered to the normal state, the fans 22 return from the one-fan-failed state (S42) to the normal fan state (S41); and if two of the fans 22 have failed, the fans 22 make transition from the one-fan-failed state (S42) to a two-fan-failed state (S43).

If one or more fans 22 are in a failed state under this circumstance, the fans 22 are maintained in the two-fan-failed state (S43). If the failed two fans 22 are then removed and fan replacement work is started, the fans 22 make transition from the twofan-failed state (S43) to a replacement state (S44).

If one or more fans 22 fail in the replacement state (S44), the fans 22 return from the replacement state (S44) to the two-fan-failed state (S43). Furthermore, if both the two failed fans 22 are replaced in the replacement state (S44), then normal fans 22 are inserted, and all the fans 22 recover to the normal state, the fans 22 return from the replacement state (S44) to the normal fan state (S41).

Figure 27:
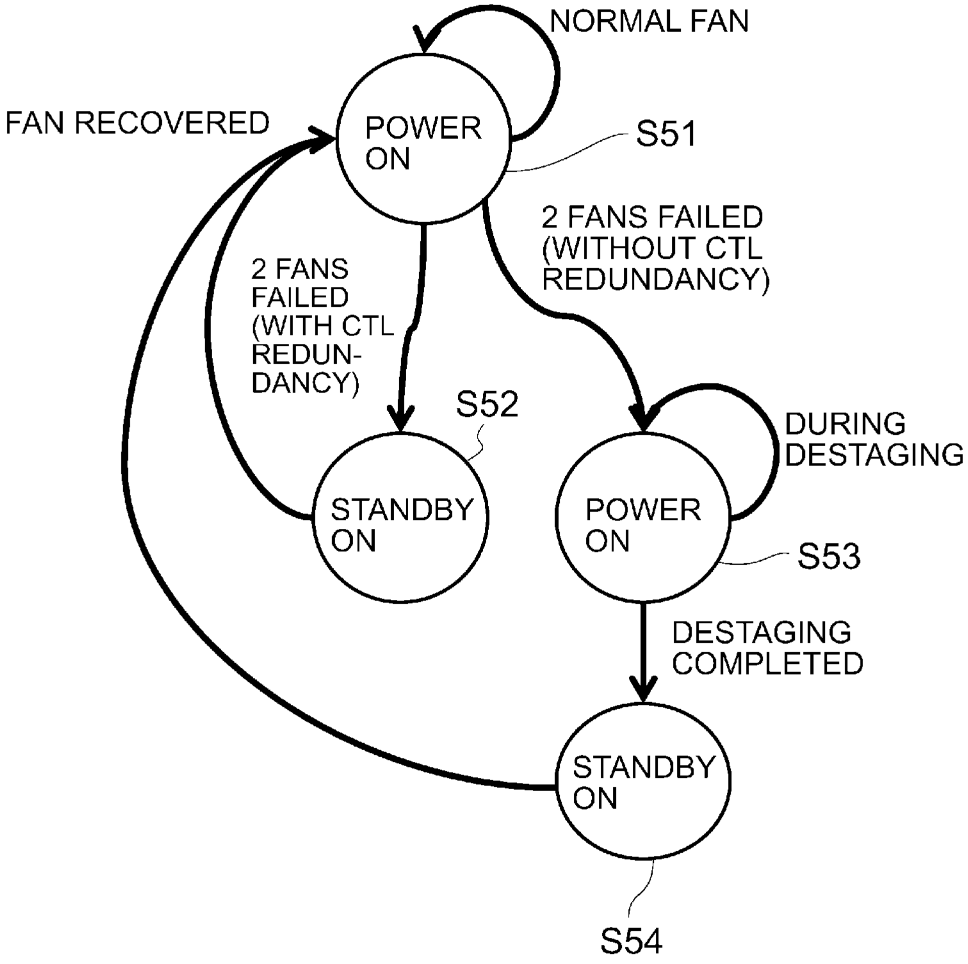
FIG. 27 is a state transition diagram for explaining the status of the power source.

Next, FIG. 27 shows a state transition diagram of the controller at the time of the fan failure.

For example, if all the three fans 22 are normal as shown in FIG. 27, the controller 24 is in a power-on state (S51). Incidentally, since both the controller 24 and the controller 32 make transition in the same state, only the status of the controller 24 will be explained.

Then, if two fans 22 fail and the controller 32 is normal and the configuration of the controller 32 and the configuration of the controller 24 are redundant, the controller 24 makes transition from the power-on state (S51) to the standby-on state (S52). If all the failed fans 22 have recovered under this circumstance, the controller 24 returns from the standby-on state (S52) to the power-on state (S51).

On the other hand, if two fans 22 fail and the controller 32 is deactivated and the configuration of the controller 32 and the configuration of the controller 24 are not redundant when the controller 24 is in the power-on state (S51), the controller 24 makes transition to the power-on state (S53). Under this circumstance, the controller 24 is also in the power-on state (S53) during destaging. Subsequently, when the destaging processing is completed, the controller 24 makes transition from the poweron state (S53) to the standby-on state (S54).

Next, on condition that all the failed fans 22 have recovered, the controller 24 returns from the standby-on state (S54) to the power-on state (S51).

This embodiment is designed so that if a fan failure of two or more fans 22 out of three fans 22 occurs, and on condition that the controller 32 is in the normal state, the controller 24 controls the power source (the first power source) of the cluster 18 in the standby state; and if the power source of the cluster 20 is in the standby state or the controller 32 is in the deactivated state, the controller 24 executes the destaging processing and then controls the power source of the cluster 18 in the standby state. As a result, even if a fan failure of the two or more fans 22, 30 occurs in the cluster 18, 20, data loss can be avoided.

Furthermore, the controllers 24, 32 have the same functions. So, if a failure of two or more fans 30 out of three fans 30 occurs, and on condition that the controller 24 is in the normal state, the controller 32 can control the power source (the second power source) of the cluster 20 in the standby state; and if the power source of the cluster 18 is in the standby state or the controller 24 is in the deactivated state, the controller 32 can execute the destaging processing and then control the power source of the cluster 20 in the standby state.

(Second Embodiment)

This embodiment is designed so that if a fan failure occurs in at least one of the redundant controllers, on condition that the other controller is in the normal state, the one controller controls its own power source in the standby state; and if the other controller is in the standby state or the deactivated state, the one controller executes backup processing and then controls its own power source in the standby state.

Figure 28:
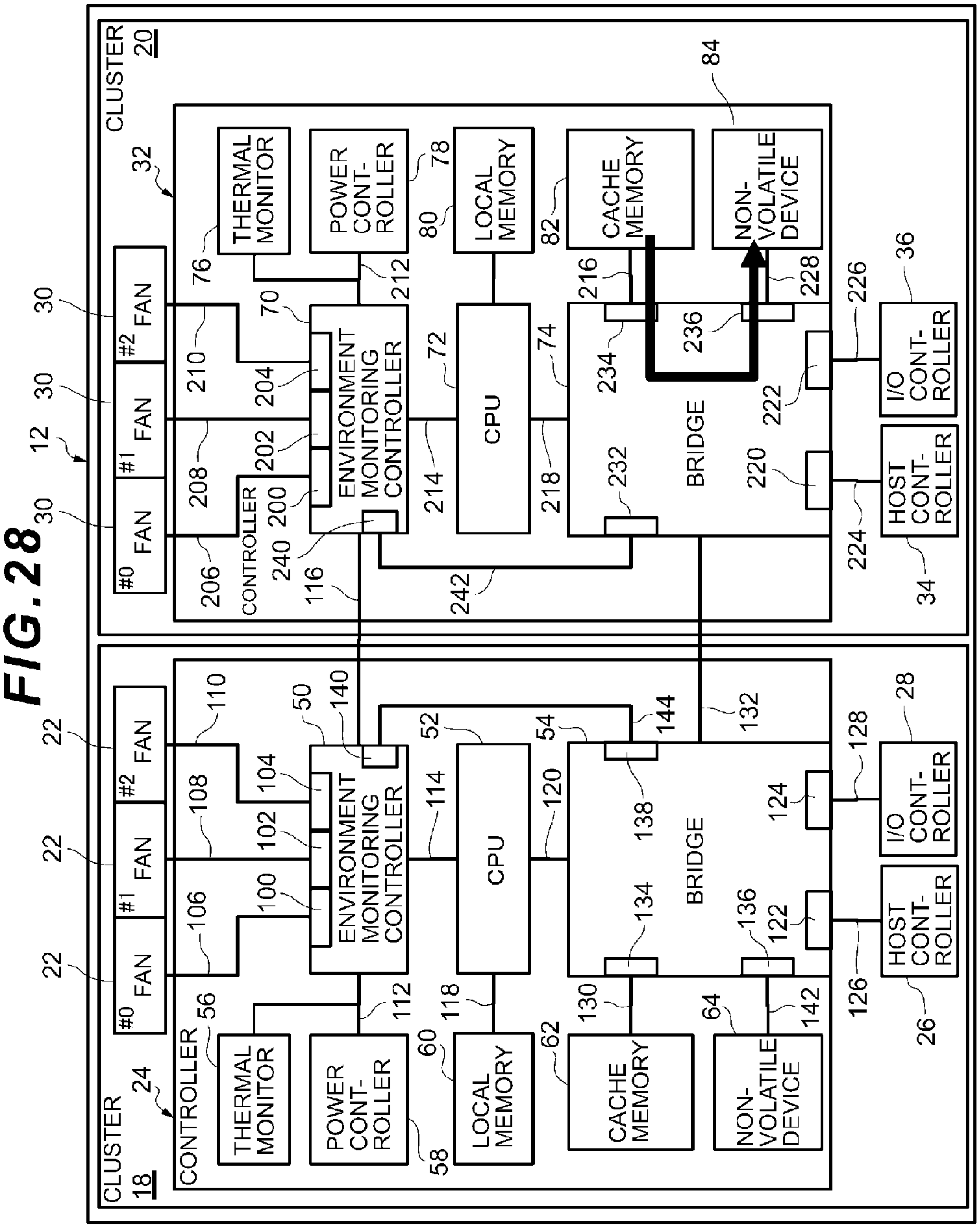
FIG. 28 is an internal configuration diagram of each cluster to which a non-volatile device is added according to a second embodiment of the present invention.

Next, FIG. 28 shows a configuration diagram of clusters, to which a nonvolatile device for backups is added respectively, according to the second embodiment of the present invention.

Referring to FIG. 28, a nonvolatile device 64 is added to the cluster 18 and a non-volatile device 84 is added to the cluster 20.

Under this circumstance, ports 134, 136, 138 are located, in addition to the ports 122, 124, at the bridge 54 and a port 140 is located at the environment monitoring controller 50. The port 134 is connected via a path 130 to the cache memory 62, the port 136 is connected via a path 142 to the nonvolatile device 64, and the port 138 is connected via a path 144 to the port 140.

Furthermore, ports 232, 234, 236 are located, in addition to the ports 220, 222, at the bridge 74 and a port 240 is located at the environment monitoring controller 70. The port 232 is connected via a path 242 to the port 240, the port 234 is connected via a path 216 to the cache memory 82, and the port 236 is connected via a path 228 to the nonvolatile device 84.

For example, an SSD can be used as the nonvolatile device 64, 84.

Furthermore, the paths 144, 242 are configured as backup control paths. Specifically speaking, the path 144 is used at the time of a backup due to power outage and for communication between the environment monitoring controller 50, the cache memory 62, and the nonvolatile device 64; and the path 242 is used at the time of a backup due to power outage and for communication between the environment monitoring controller 70, the cache memory 82, and the nonvolatile device 84.

Under this circumstance, the controllers 24, 32 control the power sources of the clusters 18, 20 respectively as backup power sources at the time of a backup and manage the cache memories 62, 82 for temporarily storing data requested by an access request from an access requestor, and the nonvolatile devices 64, 86 which are save locations for the data stored in the cache memories 62, 82, as power supply targets of the backup power sources.

Figure 29:
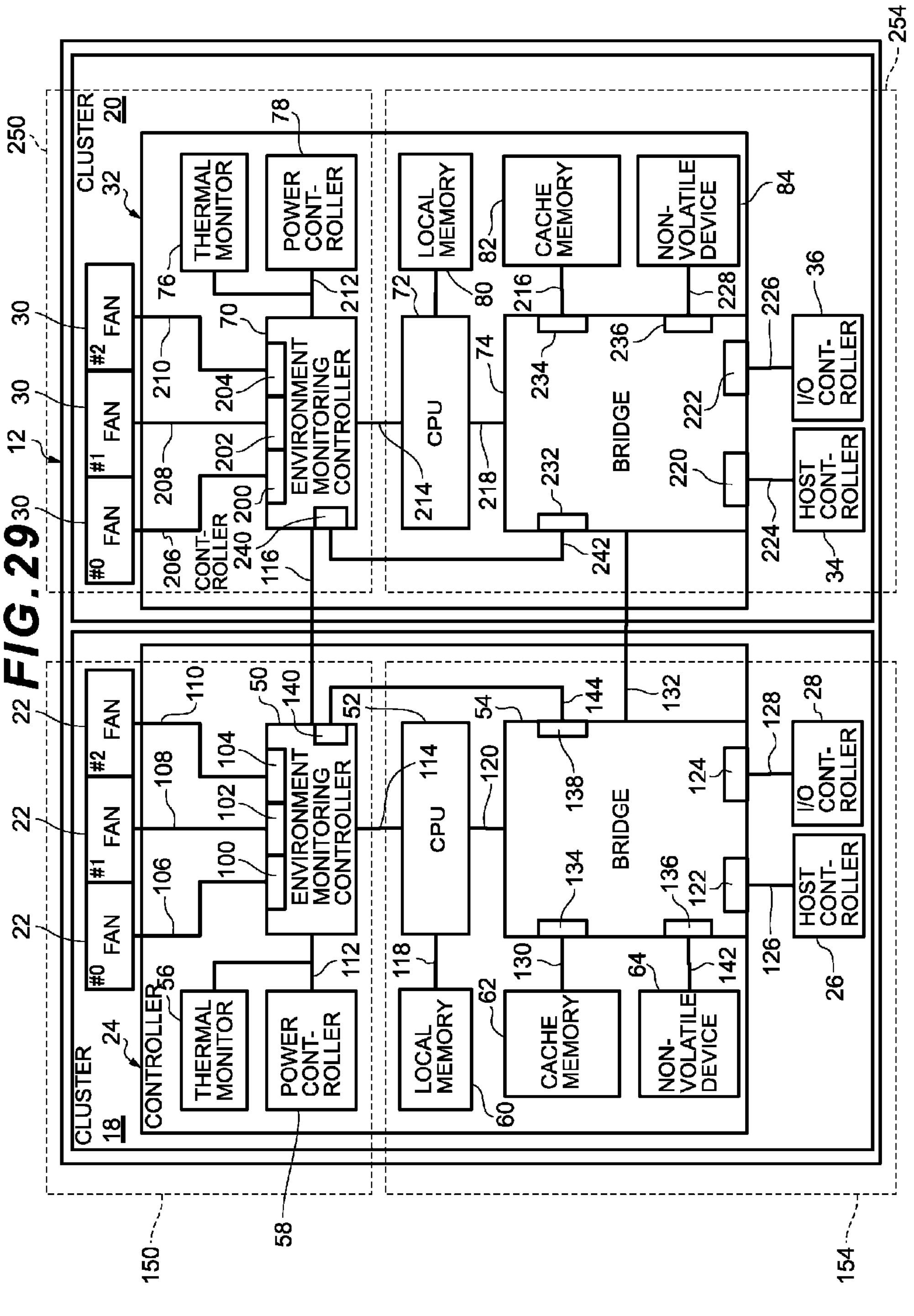
FIG. 29 is a configuration diagram for explaining power supply areas of each cluster to which the nonvolatile device is added.

Next, FIG. 29 shows a configuration diagram for explaining power supply areas of the clusters to which the nonvolatile devices are added.

Referring to FIG. 29, a power supply area 150 is a power supply area of the cluster 18 and a power supply area at the time of standby on. A power supply area 154 is a power supply area of the cluster 18 and a power supply area at the time of power on. No power is supplied to components belonging to this power supply area 154 at the time of standby on.

Furthermore, a power supply area 250 is a power supply area of the cluster 20 and a power supply area at the time of standby on. On the other hand, a power supply area 254 is a power supply area of the cluster 20 and a power supply area at the time of power on. No power is supplied to components belonging to this power supply area 254 at the time of standby on.

Figure 30:
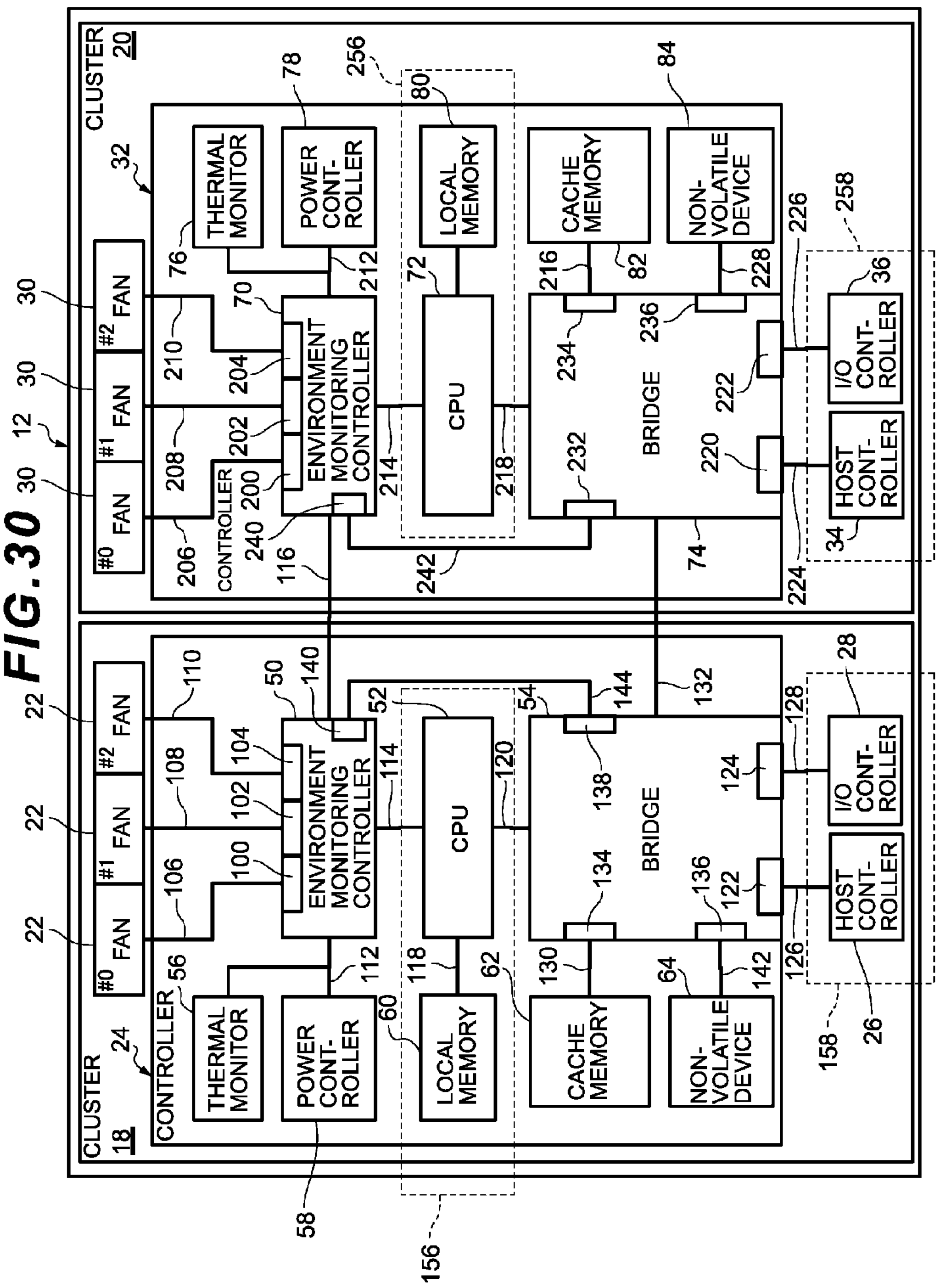
FIG. 30 is a configuration diagram for explaining non-power supply areas of each cluster to which the nonvolatile device is added.

FIG. 30 shows a configuration diagram for explaining non-power supply areas at the time of a backup where the non-volatile devices are added.

Referring to FIG. 30, regarding the cluster 18 at the time of a backup, the local memory 60 and the CPU 52 belong to a non-power supply area 156 and the host controller 26 and the I/O controller 28 belong to a non-power supply area 158 in order to reduce power consumption, so that the electric power is supplied only to other components.

Similarly, regarding the cluster 20 at the time of a backup, the local memory 80 and the CPU 72 belong to a non-power supply area 256 and the host controller 34 and the I/O controller 36 belong to a non-power supply area 258, so that the electric power is supplied only to other components. Specifically speaking, the backup processing is executed by using the environment monitoring controllers 50, 70 without using the CPUs 52, 72.

Figure 31:
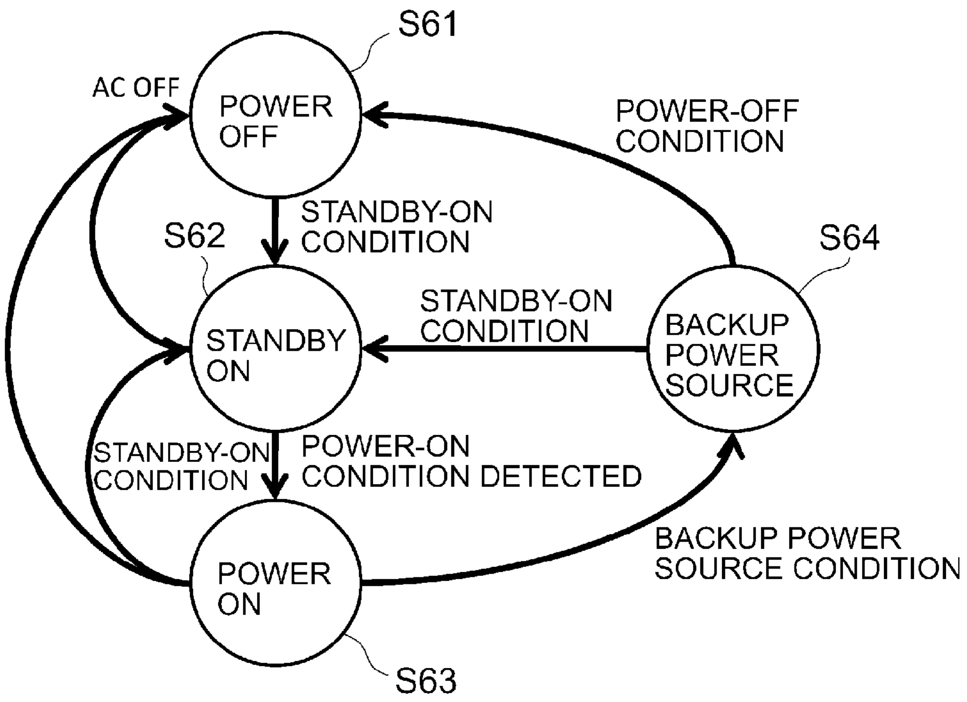
FIG. 31 is a state transition diagram for explaining the status of the power source of each cluster to which the non-volatile device is added.

Next, FIG. 31 shows a state transition diagram for explaining the status of the power source when the nonvolatile devices are added.

Referring to FIG. 31, when the power switch is in an off state, the power source of the cluster 18 or the cluster 20 is in a power-off state (S61). Then, if the power switch is turned on and the standby-on condition is fulfilled, the power source of the cluster 18 or the cluster 20 makes transition from the power-off state (S61) to the standby-on state (S62). Subsequently, if the power switch for the power supply device is turned off again, the power source of the cluster 18 or the cluster 20 returns from the standby-on state (S62) to the power-off state (S61); and if the power-on condition is fulfilled, the power source of the cluster 18 or the cluster 20 makes transition from the standby-on state (S62) to the power-on state (S63).

If the standby-on condition is fulfilled under this circumstance, the power source of the cluster 18 or the cluster 20 returns from the power-on state (S63) to the standby-on state (S62); and if the power switch is turned off when it is in the power-on state, it returns from the power-on state (S63) to the power-off state (S61).

Furthermore, if power outage is detected or a failure of two fans 22 or 30 is detected when the power source of the cluster 18 or the cluster 20 is in the power-on state (S63), the condition for using the backup power source is fulfilled, so that the power source makes transition from the power-on state (S63) to a backup power source state (S64).

If the standby-on condition is fulfilled, for example, data in the cache memory 62 is saved to the nonvolatile device 64 when the power source of the cluster 18 or the cluster 20 is in the backup power source state (S64), the power source returns from the backup power source state (S64) to the standby-on state (S62).

Furthermore, if the capacity of the power supply device decreases and a power-off condition is fulfilled when the power source of the cluster 18 or the cluster 20 is in the backup power source state (S64), the power source returns from the backup power source state (S64) to the power-off state (S61).

Figure 32:
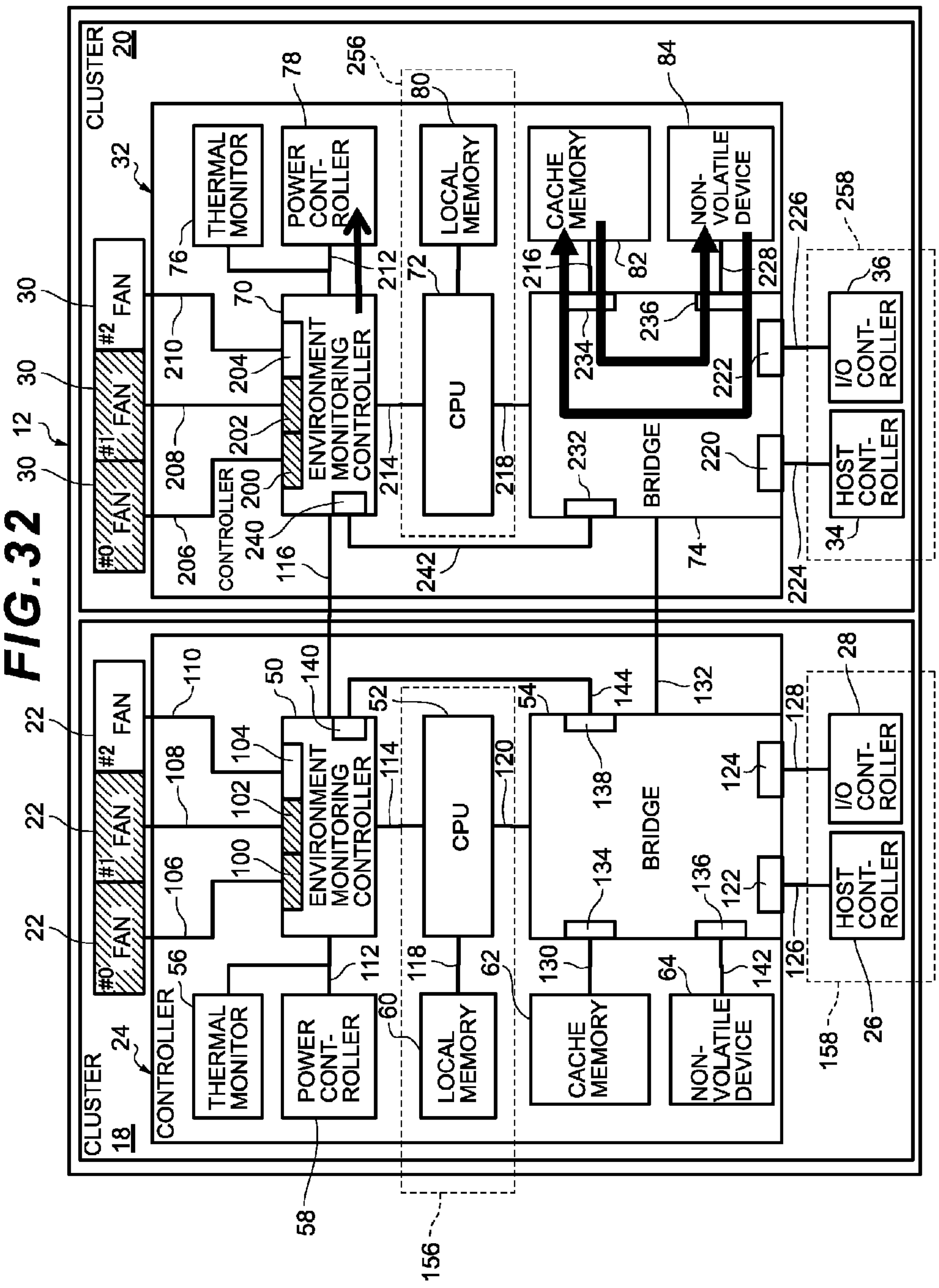
FIG. 32 is a configuration diagram showing a state where a fan failure occurs in each cluster to which the nonvolatile device is added.

Next, FIG. 32 shows a configuration diagram of the clusters having the nonvolatile devices at the time of a fan failure.

If a failure of two or more fans occurs in the cluster 18 or the cluster 20 as shown in FIG. 32, processing for the fan failure in one cluster is executed. For example, the same processing as shown in FIG. 21 is executed in the cluster 18.

On the other hand, if a fan failure of two or more fans occurs in each of the cluster 18 and the cluster 20, processing for setting the power source of each cluster 18, 20 to the standby state and then saving data in the cache memory 62 or the cache memory 82 to the nonvolatile device 64 or the nonvolatile device 84 is executed.

Figure 33:
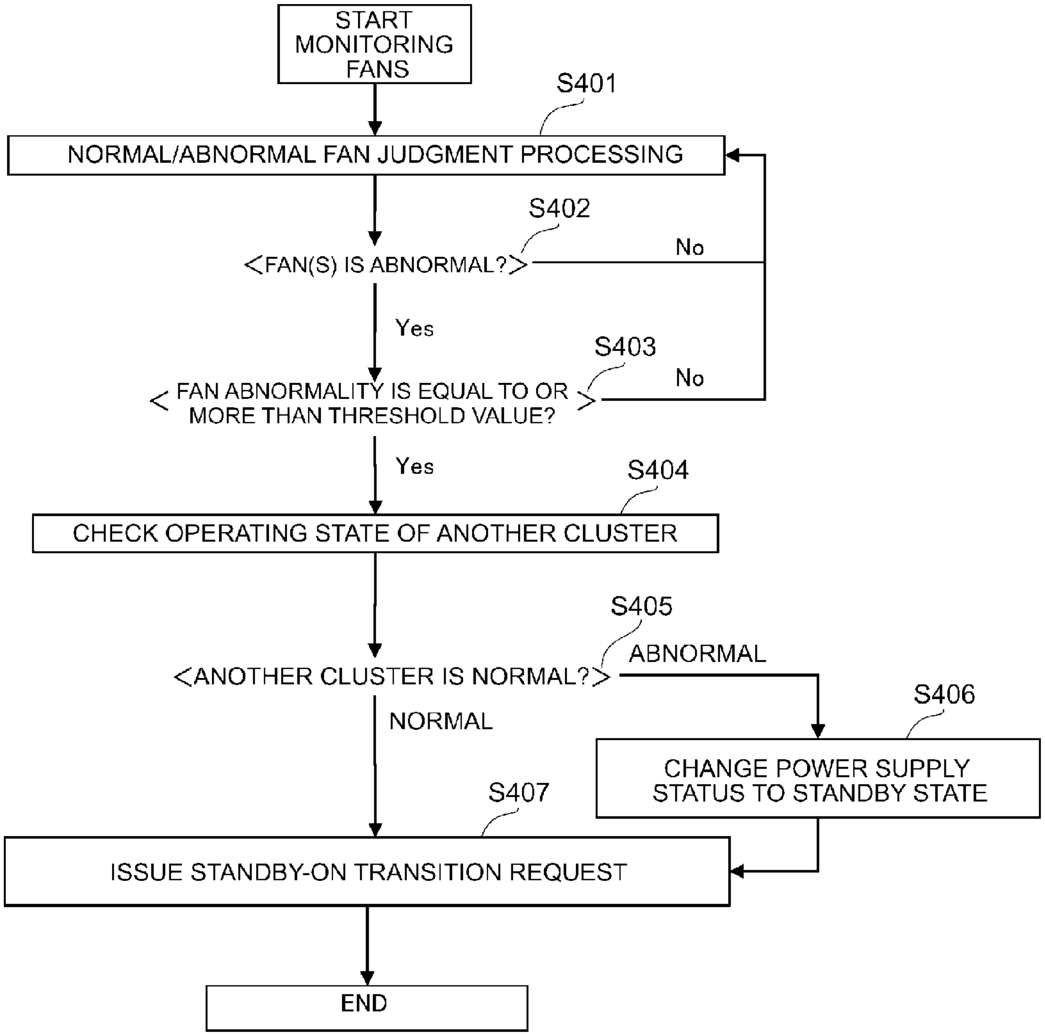
FIG. 33 is a flowchart for explaining processing executed at the time of the fan failure in each cluster to which the non-volatile device is added.

Processing for the fan failure in the cluster having the nonvolatile device will be explained with reference to a flowchart in FIG. 33. Incidentally, since the main microprogram 162 and the main microprogram 262 execute the same processing, only the processing by the main microprogram 162 will be explained.

Firstly, after starting the fan monitoring processing, the main microprogram 162 executes processing for judging, based on the monitoring result from the environment monitoring program 160, whether the fans 22 are normal or abnormal (S401).

The main microprogram 162 judges, based on the monitoring result from the environment monitoring program 160, whether the fans 22 are abnormal or not (S402); and if no abnormality is found in each fan 22, the main microprogram 162 returns to the processing in step S401; if it is determined that any of the fans 22 is abnormal, the main microprogram 162 judges whether the fan abnormality is equal to or more than a threshold (S403).

If the main microprogram 162 determines in step S403 that the fan abnormality is not equal to or more than the threshold, that is, if it determines that one of the three fans 22 is abnormal, it returns to the processing in step S401.

On the other hand, if the main microprogram 162 determines in step S403 that the fan abnormality is equal to or more than the threshold, that is, if it determines that the two or more fans 22 are abnormal, the main microprogram 162 executes processing for checking the operating state of the other cluster (cluster 20) (S404).

When this happens, the main microprogram 162 refers to the CPU register management table 400 and judges whether the other cluster, that is, the cluster 20 is normal or not (S405).

If the main microprogram 162 determines in step S405 that the cluster 20 is abnormal, this means that the cluster 20 is in the deactivated state or the standby state, the main microprogram 162 sets the power source of the cluster 18 to the standby state (backup state) and executes the backup processing for saving data in the cache memory 62 to the nonvolatile device 64 (S406).

Specifically speaking, the main microprogram 162 executes the backup processing for storing data, which is stored in the cache memory 62, in the nonvolatile device 64 before the cluster 18 makes transition to the standby-on state.

On the other hand, if the main microprogram 162 determines in step S405 that the cluster 20 is normal, or if it executes the backup processing in step S406, the main microprogram 162 issues a request to the environment monitoring program 160 to have the cluster 18 make transition to the standby-on state (S407), and then sets the operating state of the cluster 18 to the deactivated state, registers this setting result to the CPU register management table 410, and terminates the processing in this routine.

Furthermore, the environment monitoring program 160 which has received the request from the main microprogram 162 for having the cluster 18 make transition to the standby-on state issues standby-on setting instruction to the power controller 58. Once the power controller 58 sets the power supply device to the standby-on state, the cluster 18 makes transition from the power-on state to the standby-on state (the standby state). Then, the environment monitoring program 160 executes processing for monitoring recovery of the failed fans 22 to the normal state.

Furthermore, if the cluster 20, which is the other cluster, is in the deactivated state, the main microprogram 162 issues notice to the environment monitoring program 160 so that transition to the backup power source state should be made. As a result, the en-vironment monitoring program 160 executes processing for having the cluster 18 and the cluster 20 make transition to the backup power source state, stops supplying power to the CPUs 52, 72 and the local memories 60, 80, which are heat generating sources, and stops supplying power to the host controllers 26, 34, the I/O controllers 28, 36.

Under this circumstance, the environment monitoring program 160 executes processing for having the power controller 58 make transition to the backup power source state.

Furthermore, the environment monitoring program 160 executes the backup processing for storing data, which is stored in the cache memory 62, in the nonvolatile device 64; and after the completion of the backup processing, the environment monitoring program 160 can issue a standby-on transition control request to the power controller 58.

If the power source of the cluster 18 enters the standby-on state by means of the power supply control of the power controller 58, the environment monitoring program 160 in the standby-on state monitors recovery of the failed fans 22 to the normal state.

If all the failed fans 22 have recovered to the normal state, the environment monitoring program 160 executes processing for writing back the data, which has been backed up to the nonvolatile device 64, to the cache memory 62.

Figure 34:
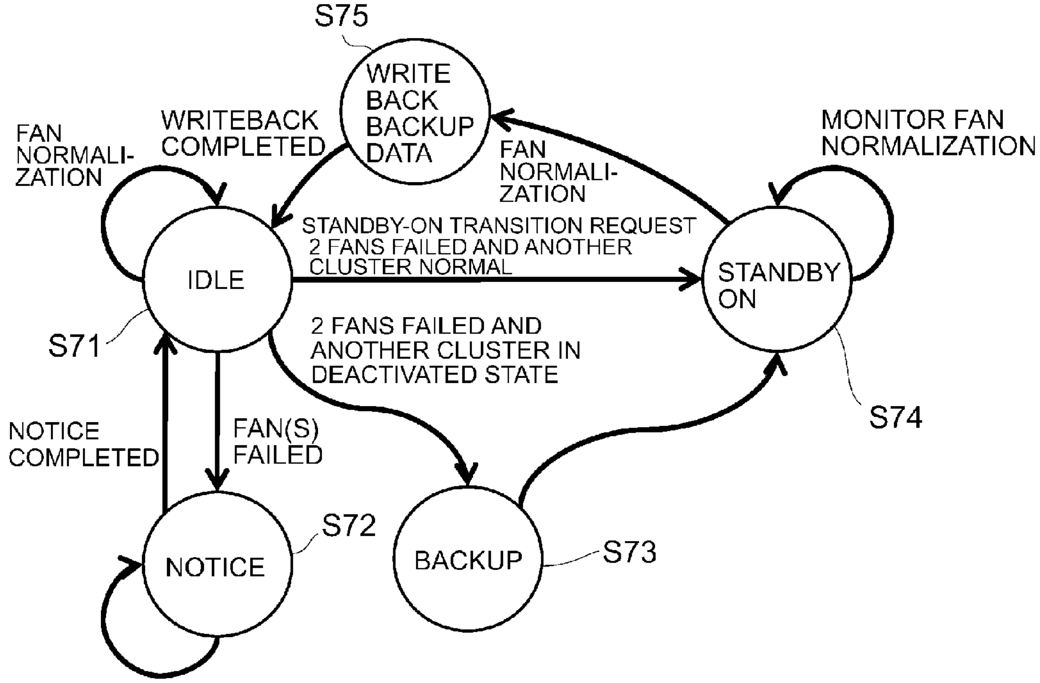
FIG. 34 is a state transition diagram for explaining the status of the environment monitoring program in each cluster to which the nonvolatile device is added.

Next, FIG. 34 shows a state transition diagram for explaining the status of processing executed by the environment monitoring program.

Referring to FIG. 34, if all the fans 22 are normal, the environment monitoring program 160 is in an idle state (S71); and this state is maintained while all the fans 22 are normal. If a failure of the fans 22 occurs when the environment monitoring program 160 is in the idle state (S71), the environment monitoring program 160 makes transition to a state of issuing notice of the fan failure to the main microprogram 162 (S72); and when the fan failure notice is completed, the environment monitoring program 160 returns from the state of issuing the notice of the fan failure (S72) to the idle state (S71).

On the other hand, if a failure of two or more fans 22 occurs and the cluster 20 is in the deactivated state when the environment monitoring program 160 is in the idle state (S71), the environment monitoring program 160 makes transition from the idle state (S71) to a backup state (S73); and then, on condition that the destaging processing has been completed, the environment monitoring program 160 makes transition from the backup state (S73) to the standby-on state (S74).

Furthermore, if the standby-on transition request is input from the main microprogram 162 or a failure of two or more fans 22 occurs and the cluster 20 is normal when the environment monitoring program 160 is in the idle state (S71), the environment monitoring program 160 makes transition from the idle state (S71) to the standby-on state (S74).

When the environment monitoring program 160 is in the standby-on state (S74), it monitors whether all the fans 22 are normalized or not; and if all the fans 22 are normalized, the environment monitoring program 160 makes transition to a backup data writeback state (S75) of writing back the data, which has been backed up to the nonvolatile memory 64, to the cache memory 62; and then, on condition that the data writeback has been completed, the environment monitoring program 160 returns from the backup data writeback state (S75) to the idle state (S71).

This embodiment is designed so that if a fan failure of two or more fans 22 out of the three fans 22 occurs, and on condition that the controller 32 is in the normal state, the controller 24 at the time of a backup controls the power source (the first power source) of the cluster 18 in the standby state; and if the power source of the cluster 20 is in the standby state or the controller 32 is in the deactivated state, the controller 24 executes, instead of the destaging processing, the backup processing for storing data, which is stored in the cache memory 62, in the nonvolatile device 64 and then controls the power source of the cluster 18 in the standby state. As a result, even if a fan failure of the two or more fans 22, 30 occurs in the cluster 18, 20, data loss can be avoided.

Furthermore, the controllers 24, 32 have the same functions. So, if a failure of two or more fans 30 out of three fans 30 occurs, and on condition that the controller 24 is in the normal state, the controller 32 at the time of a backup can control the power source (the second power source) of the cluster 20 in the standby state; and if the power source of the cluster 18 is in the standby state or the controller 24 is in the deactivated state, the controller 32 can execute, instead of the destaging processing, the backup processing for storing data, which is stored in the cache memory 82, in the nonvolatile device 84 and then control the power source of the cluster 20 in the standby state.

Furthermore, according to each embodiment, if the failed fans 22, 30 have recovered to the normal state, the controller 24, 32 controls the power source of the cluster 18, 20 in the power-on state, so that each cluster 18, 20 can be restored to the normal state after replacement of the fans.

In each embodiment, the number of fans used as the threshold for the failure judgment of the fans 22, 30 is two; and when two or more fans 22 or 30 fail to operate, it is considered as the occurrence of a fan failure. However, if the number of the fans 22, 30 is three or more, the threshold to be used for the failure judgment of the fans 22, can be set as a value equal to or more than three.

Furthermore, when setting the threshold to be used for the failure judgment of the fans 22, 30, the threshold can be changed according to the load on each controller 24, 32, for example, data input/output load.

Under this circumstance, each controller 24, 32 monitors the data input/output status and changes the threshold for the fan failure judgment according to the load on each controller 24, 32.

For example, if the fans 22 or 30 are composed of three fans and the load on each controller 24, 32 is less than a (load<a), the threshold is set to 1. If the load on each controller 24, 32 is equal to or more than a and less than b (a<=load on each controller 24, 32<b), the threshold is set to 2. Furthermore, if the load on each controller 24, 32 is equal to or more than b(b<=load on each controller 24, 32), the threshold is set to 3.

If the threshold is changed in this example, and when the load on each controller 24, 32 is low (in a case of low load), the operation is possible even by using a small number of the fans 22, 30.

Incidentally, the present invention is not limited to the aforementioned embodiments, and includes various variations. For example, the aforementioned embodiments have been described in detail in order to explain the invention in an easily comprehensible manner and are not necessarily limited to those having all the configurations explained above. Furthermore, part of the configuration of a certain embodiment can be replaced with the configuration of another embodiment and the configuration of another embodiment can be added to the configuration of a certain embodiment. Also, part of the configuration of each embodiment can be deleted, or added to, or replaced with, the configuration of another configuration.

Furthermore, part or all of the aforementioned configurations, functions, processing units, processing means, and so on may be realized by hardware by, for example, designing them in integrated circuits. Also, each of the aforementioned configurations, functions, and so on may be realized by software by processors interpreting and executing programs for realizing each of the functions. Information such as programs, tables, and files for realizing each of the functions may be recorded and retained in memories, storage devices such as hard disks and SSDs (Solid State Drives), or storage media such as IC (Integrated Circuit) cards, SD (Secure Digital) memory cards, and DVDs (Digital Versatile Discs).

REFERENCE SIGNS LIST

Storage system
12 Storage apparatus
14 Storage device
16 Host server

18 Cluster
20 Cluster
22 Fans
24 Controller
26 Host controller
28 I/O controller
30 Fans
32 Controller
34 Host controller
36 I/O controller
38, 40 Network
42 Storage units
50 Environment monitoring controller
52 CPU
54 Bridge
56 Thermal monitor
58 Power controller
60 Local memory
62 Cache memory
64 Nonvolatile device
70 Environment monitoring controller
72 CPU
74 Bridge
76 Thermal monitor
78 Power controller
80 Local memory
82 Cache memory
84 Nonvolatile device

The invention claimed is:

1. A storage system comprising: a first controller configured to control a first power source in a standby state or a power-on state; a plurality of first fans configured to cool the first controller; a second controller configured to control a second power source in the standby state or the power-on state and send and receive information to and from the first controller; a plurality of second fans configured to cool the second controller; and a storage device including a plurality of storage units;

wherein when the first power source is in the standby state, the first controller is configured to control the first fans; and when the first power source is in the power-on state, the first controller is configured to control the first fans and execute data input/output processing on the storage device;

wherein when the second power source is in the standby state, the second controller is configured to control the second fans; and when the second power source is in the power-on state, the second controller is configured to control the second fans and execute the data input/output processing on the storage device; and wherein when a fan failure occurs in a fan of the first fans or the second fans for cooling at least one controller of the first controller and the second controller, on condition that the other controller is in a normal state, the one controller is configured to control a power source of either the first power source or the second power source, which is a control target of the one controller, in the standby state; and when a power source which is a control target of the other controller is in the standby state, on condition that a destaging processing is executed, the one controller is configured to control the power source, which is the control target of the one controller, in the standby state, wherein a destaging processing is storing data, which is stored in the cache memory, in the storage units.

2. The storage system according to claim 1, wherein when abnormality of the fans for cooling the one controller is equal to or more than a threshold, the one controller is configured to judge that the fan failure has occurred in the fans for cooling the one controller; and execute the destaging processing based on the judgment result.

3. The storage system according to claim 2, wherein the one controller is configured to execute the data input/output processing on the storage device in accordance with an access request from an access requestor and store data, which is requested by the access request, in a cache memory; and when executing the destaging processing, the one controller is configured to store the data, which is stored in the cache memory, in the storage device.

4. The storage system according to claim 1, wherein at the time of a backup, the first controller is configured to control the first power source as a first backup power source and manage a first cache memory for temporarily storing data requested by an access request from an access requestor, and a first nonvolatile device as a save location of the data stored in the first cache memory, respectively, as power supply targets of the first backup power source;

wherein at the time of the backup, the second controller is configured to control the second power source as a second backup power source and manage a second cache memory for temporarily storing data requested by an access request from the access requestor, and a second nonvolatile device as a save location of the data stored in the second cache memory, respectively, as power supply targets of the second backup power source; and wherein when at the time of the backup a fan failure occurs in fans of the first fans or the second fans for cooling at least the one controller of the first controller and the second controller, on condition that the other controller is in a normal state, the one controller is configured to control a power source, which is a control target of the one controller, in the standby state; and when a power source which is a control target of the other controller is in the standby state, the one controller is configured to execute, instead of executing the destaging processing, backup processing for storing data, which is stored in a cache memory of either the first cache memory or the second cache memory, that is the power supply target of the backup power source managed by the one controller, in a nonvolatile device as the power supply target of the backup power source managed by the one controller and then control the power source, which is the control target of the one controller, in the standby state.

5. The storage system according to claim 4, wherein when the fans, in which the fan failure occurred, have recovered to a normal state after executing the backup processing, at least the one controller of the first controller and the second controller is configured to execute processing for writing back the data, which is stored in the nonvolatile device as the power supply target of the backup power source managed by the one controller, to the cache memory as the power supply target of the backup power source managed by the one controller.

6. The storage system according to claim 1, wherein when the fans, in which the fan failure occurred, have recovered to a normal state, at least the one controller of the first controller and the second controller is configured to control the power source, as the control target of the one controller, in the power-on state.

7. A method for controlling a storage system including: a first controller for controlling a first power source in a standby state or a power-on state; a plurality of first fans for cooling the first controller; a second controller for controlling a second power source in the standby state or the power-on state and sending and receiving information to and from the first controller; a plurality of second fans for cooling the second controller; and a storage device including a plurality of storage units;

wherein when the first power source is in the standby state, the first controller controls the first fans; and when the first power source is in the power-on state, the first controller controls the first fans and executes data input/output processing on the storage device;

wherein when the second power source is in the standby state, the second controller controls the second fans; and when the second power source is in the power-on state, the second controller controls the second fans and executes the data input/output processing on the storage device; and wherein the storage system control method comprises the steps which are executed by at least one controller of the first controller and the second controller: controlling a power source of either the first power source or the second power source, which is a control target of at least one controller of the first controller and the second controller, in the standby state when a fan failure occurs in a fan of the first fans or the second fans for cooling the one controller and on condition that the other controller is in a normal state; and controlling the power source, which is the control target of the one controller, in the standby state when a power source which is a control target of the other controller is in the standby state and on condition that a destaging processing is executed, wherein a destaging processing is storing data, which is stored in the cache memory, in the storage units.

8. The storage system control method according to claim 7, wherein when abnormality of the fans for cooling the one controller is equal to or more than a threshold, the one controller judges that the fan failure has occurred in the fans for cooling the one controller; and executes the destaging processing based on the judgment result.

9. The storage system control method according to claim 8, wherein the one controller executes the data input/output processing on the storage device in accordance with an access request from an access requestor and stores data, which is requested by the access request, in a cache memory; and when executing the destaging processing, the one controller stores the data, which is stored in the cache memory, in the storage device.

10. The storage system control method according to claim 7, wherein at the time of a backup, the first controller controls the first power source as a first backup power source and manages a first cache memory for temporarily storing data requested by an access request from an access requestor, and a first nonvolatile device as a save location of the data stored in the first cache memory, respectively, as power supply targets of the first backup power source;

wherein at the time of the backup, the second controller controls the second power source as a second backup power source and manages a second cache memory for temporarily storing data requested by an access request from the access requestor, and a second nonvolatile device as a save location of the data stored in the second cache memory, respectively, as power supply targets of the second backup power source; and wherein when at the time of the backup a fan failure occurs in fans of the first fans or the second fans for cooling at least the one controller of the first controller and the second controller, on condition that the other controller is in a normal state, the one controller controls a power source, which is a control target of the one controller, in the standby state; and when a power source which is a control target of the other controller is in the standby state, the one controller executes, instead of executing the destaging processing, backup processing for storing data, which is stored in a cache memory of either the first cache memory or the second cache memory, that is the power supply target of the backup power source managed by the one controller, in a nonvolatile device as the power supply target of the backup power source managed by the one controller and then controls the power source, which is the control target of the one controller, in the standby state.

11. The storage system control method according to claim 10, wherein when the fans, in which the fan failure occurred, have recovered to a normal state after executing the backup processing, at least the one controller of the first controller and the second controller executes processing for writing back the data, which is stored in the nonvolatile device as the power supply target of the backup power source managed by the one controller, to the cache memory as the power supply target of the backup power source managed by the one controller.

12. The storage system control method according to claim 7, wherein when the fans, in which the fan failure occurred, have recovered to a normal state, at least the one controller of the first controller and the second controller controls the power source, as the control target of the one controller, in the power-on state.

* * * * *